United States Patent [19]

Rohde et al.

[11] Patent Number: 4,786,569

[45] Date of Patent: Nov. 22, 1988

[54] ADHESIVELY BONDED PHOTOSTRUCTURABLE POLYIMIDE FILM

[75] Inventors: Ottmar Rohde; Armin Schaffner, both of Basel, Switzerland

[73] Assignee: Ciba-Geigy Corporation, Ardsley, N.Y.

[21] Appl. No.: 901,095

[22] Filed: Aug. 27, 1986

[30] Foreign Application Priority Data

Sep. 4, 1985 [CH] Switzerland .......................... 3809/85
Oct. 25, 1985 [CH] Switzerland .......................... 4607/85

[51] Int. Cl.$^4$ .......................... G03C 5/16; G03C 1/80; G03C 1/84
[52] U.S. Cl. .......................... 430/14; 430/271; 430/272; 430/273; 430/312; 430/325; 430/156
[58] Field of Search .............. 430/273, 312, 271, 272, 430/325, 156, 14

[56] References Cited

U.S. PATENT DOCUMENTS

| | | | |
|---|---|---|---|
| 3,450,613 | 6/1969 | Steinberg | 204/159.15 |
| 3,469,982 | 9/1969 | Celeste | 96/35.1 |
| 3,526,504 | 9/1970 | Celeste | 96/35.1 |
| 3,752,750 | 8/1973 | Matsushita et al. | 204/181 |
| 3,824,104 | 7/1974 | Kloczewski et al. | 96/115 R |
| 3,861,921 | 1/1975 | Hoffmann et al. | 430/273 |
| 3,925,320 | 12/1975 | Morgan | 260/77.5 CR |
| 4,045,516 | 8/1977 | Morgan | 428/419 |
| 4,090,936 | 5/1978 | Barton | 96/115 P X |
| 4,092,442 | 4/1978 | Agnihotri et al. | 427/41 |
| 4,127,436 | 11/1978 | Friel | 156/630 |
| 4,180,404 | 12/1979 | Ohmura et al. | 430/284 |
| 4,195,997 | 4/1980 | Graham | 430/286 |
| 4,220,513 | 9/1980 | Green et al. | 204/159.23 |
| 4,278,752 | 7/1981 | Gervay et al. | 430/281 |
| 4,299,938 | 11/1981 | Green et al. | 526/192 |
| 4,337,308 | 6/1982 | Franke | 430/306 |
| 4,339,567 | 7/1982 | Green et al. | 528/102 |
| 4,349,620 | 9/1982 | Cyr et al. | 430/273 X |
| 4,383,025 | 5/1983 | Green et al. | 430/280 |
| 4,398,014 | 8/1983 | Green et al. | 528/89 |
| 4,442,198 | 4/1984 | Tsao et al. | 430/311 |
| 4,451,971 | 1/1984 | Milgram | 427/82 |
| 4,506,004 | 3/1985 | Sullivan | 430/312 |
| 4,518,676 | 5/1985 | Irving | 430/280 |
| 4,548,891 | 10/1985 | Riediker et al. | 430/283 |
| 4,548,895 | 10/1985 | Irving et al. | 430/325 |
| 4,552,604 | 11/1985 | Green | 156/246 |
| 4,621,043 | 11/1986 | Gervay | 430/281 |
| 4,624,912 | 11/1986 | Zweifel et al. | 430/325 X |
| 4,629,685 | 12/1986 | Pfeifer | 430/583 |
| 4,629,777 | 11/1986 | Pfeifer . | |
| 4,656,116 | 7/1987 | Rohde et al. | 430/283 |
| 4,657,832 | 4/1987 | Pfeifer | 430/270 X |
| 4,677,186 | 6/1987 | Pfeifer | 528/220 |
| 4,680,195 | 7/1987 | Pfeifer | 430/270 X |

FOREIGN PATENT DOCUMENTS

| | | |
|---|---|---|
| 0046695 | 3/1982 | European Pat. Off. . |
| 0076656 | 4/1983 | European Pat. Off. . |
| 0115354 | 8/1984 | European Pat. Off. . |
| 0203393 | 12/1986 | European Pat. Off. . |
| 56-23150 | 5/1981 | Japan . |
| 143329 | 9/1982 | Japan . |
| 100135 | 11/1982 | Japan . |
| 58-68740 | 4/1983 | Japan . |
| 96654 | 6/1983 | Japan . |
| 108031 | 6/1984 | Japan . |
| 0098432 | 6/1985 | Japan ........................ 430/273 |
| 837966 | 6/1984 | South Africa . |
| 843733 | 1/1985 | South Africa . |
| 850973 | 9/1985 | South Africa . |
| 1516351 | 7/1978 | United Kingdom . |
| 1516352 | 7/1978 | United Kingdom . |
| 2073211A | 6/1981 | United Kingdom . |

OTHER PUBLICATIONS

Brit. Polymer Journal, 15, pp. 24–29 (1983).
J. Macro. Sci. Rev., Macro. Chem., C21(2) 187, pp. 239–243 (1981).
Chimia 38(1984), pp. 13–19.
C.A., 100, 87335t (1984).

Primary Examiner—Paul R. Michl
Assistant Examiner—Cynthia Hamilton
Attorney, Agent, or Firm—Luther A. R. Hall; Harry Falber

[57] ABSTRACT

Coated material containing in successive order
 (a) a substrate,
 (b) a photostructurable negative-working thermostable adhesive and
 (c) a self-supporting photocrosslinkable polyimide film. This arrangement can be used for producing relief images by means of photolithographic processes.

49 Claims, No Drawings

ADHESIVELY BONDED PHOTOSTRUCTURABLE POLYIMIDE FILM

The present invention relates to a coated material containing, on a substrate, a photocrosslinkable thermostable adhesive and, thereon, a photocrosslinkable polyimide film, to a process for preparing relief images by means of such coatings, to the relief images thus obtained and to the use of these images as protective and passivating layers, as dielectrics, as soldering masks or as galvanoresists in the manufacture of electronic components or circuits.

Polyimides are known to be very heat-stable and chemically inert compounds. They are of great interest for producing electronic components, since some of these manufacturing steps need to be carried out at high temperatures.

Recently, polyimides which are soluble and also photocrosslinkable in polar organic solvents were developed. They made it possible to significantly increase the possible uses for polyimides in photolithography. For instance, it is now possible to treat substrate surfaces with solutions of completely imidated polyimides and to convert these coatings directly into relief images by means of customary photolithographic processes.

However, the coating process used still leaves something to be desired. For instance, in the preparation of thick polymer layers relatively large amounts of solvents are given off as vapours, which is undesirable on industrial hygiene grounds. In addition, for example in spin-coating or curtain-coating the layer thickness is affected by the viscosity of the solution to be applied and by machine parameters, such as speed of rotation and rate of throughput, so that these parameters need to be taken into account in the coating process.

Furthermore, depending on the size and shape of the substrate to be coated it is not always possible to apply such a coating in satisfactory form or satisfactory uniformity when effecting the coating by applying a solution.

It would therefore be desirable that the preparation of the actual protective layer should take place before the coating, for example by providing an appropriate polyimide film. Such a film could then be applied to the substrate in a simple manner, for example from a roll.

It has now been found that these photocrosslinkable polyimides, although they are photosensitive, do form self-supporting films of high strength and dimensional stability. It has further been found that with certain polyimides the photocrosslinking reaction takes places throughout the entire layer thickness range. It is consequently possible, in principle, to use these polyimides as films in imaging processes or in the preparation of protective layers. Owing to their high chemical and mechanical strength, however, there exists no obvious bond to the substrate which does not impair the photo process.

It is further necessary that the bonding used should withstand the thermal stresses envisaged for these protective layers, which strongly restricts the choice of potential adhesives.

It has further been found in the preparation of polyimide layers from solutions that the layers thus prepared are, due to the drying process, under an inherent tension which can have an adverse effect on the adhesion, in particular in the case of layer thicknesses greater than 10 μm. Moreover, there exists, in particular in the case of smooth and chemically inert surfaces, a general demand for further improvement in the adhesion of these polyimides. However, a coating sequence of substrate, adhesive layer, plus polyimide from solution is not possible in general, since the solvents to be used for soluble polyimides are generally so powerful that they would dissolve or at least strongly impair the adhesive layer lying underneath.

It has now been found that the disadvantages mentioned can be avoided and the stated requirements met by bonding a self-supporting photocrosslinkable polyimide film to the substrate by means of a corresponding thermostable photocrosslinkable adhesive.

"Thermostable", for the purposes of the present invention, applies in particular to those photostructurable adhesives which, when used alone and without further covering, can withstand a normal soldering bath at 230° C.

It has further been found that, using this layer system, relief structures of high resolution and excellent adhesion are obtained and that these relief structures at the same time approximately have the same good chemical, thermal and mechanical properties as the parent film materials. If the photostructurable adhesive has a somewhat lower thermostability than the film material, it is additionally of advantage here that the adhesive layer is, for example, protected from direct contact with oxygen at high temperatures or from direct contact with, for example, a soldering bath. It is thus possible to combine within the possible chemical sphere the good thermal properties of the polyimide film with the good adhesive properties of the adhesive in an ideal manner.

It has further been found, surprisingly, that the photocrosslinking of the film comprising soluble photocrosslinkable polyimides takes place uniformly and with high resolution over wide layer thickness ranges. As a result it is possible to obtain specific photostructuring of the photosensitive adhesive lying underneath. The result is thus an accurate and uniform definition of the relief structures over the entire layer thickness.

This is in contrast to a number of other photostructurable systems where strong light absorption takes place in the upper regions of the layer, so that the lower regions of the layer are exposed to light only to an incomplete extent.

The invention thus also makes it possible, for example when using a conventional mercury lamp whose emission in the near UV region including the short-wave visible region, consists in the main of the lines at 365, 405 and 436 nm, to sensitize the photostructurable adhesive in such a way that it is active at other wavelengths, where the film, for example, does not absorb, thereby obtaining an additional and very specific curing of the adhesive vis-a-vis the film.

It has now been found that the high light sensitivity of the polyimide film over wide thickness ranges can also be of disadvantage if the film has been applied to a strongly scattering surface, for example a porous ceramic substrate. As a consequence of this strong light scattering at the surface, crosslinking takes place in the shadow areas of the polyimide film and the resolution decreases. Nor can in general the problem be solved by adding to the polyimide film strongly absorbent substances, for example antihalo dyes, since then the sensitivity of the film is unacceptably weakened. In such cases, images cannot be prepared using films conventionally applied from solution. The non-obvious solution to the problem is then a polyimide film fixed with a photostructurable adhesive. Through careful choice of the adhesive the system can be designed in such a way that the light scattered by the surface is absorbed within the thin layer of adhesive and, nonetheless, sufficient light sensitivity of the adhesive substance is guaranteed. The polyimide film is thus not impinged upon by any scattered light, nor are the geometric shadow areas of the adhesive layer exposed.

The production of relief images by laminating on photostructurable films, in particular dry film resists, is disclosed in numerous patents, for example U.S. Pat. No. 3,526,504. Dry film resists generally comprise a support film (for example polyester), a photostructurable layer and a top layer (for example polyethylene). Application onto the substrate is effected by peeling off the top film, where appropriate also the support film, and laminating on by pressing on or by using reduced pressure, if desired at elevated temperatures.

Corresponding processes are known for example from U.S. Pat. No. 4,127,436.

Dry film resists based on polyimide have hitherto not been disclosed, nor, more particularly, has a photosensitive polyimide film which, before photostructuring, is thick enough to be self-supporting. The provision of a dry film resist system which can be exposed to significantly higher temperatures than the hitherto disclosed systems is extremely desirable.

Photostructurable systems which comprise more than one photostructurable layer are known; as are photostructurable adhesives which keep in place a superposed layer and serve for preparing relief images.

For instance, U.S. Pat. No. 4,506,004, German Offenlegungsschrift No. 2,658,422 and Japanese Preliminary Published Application No. 58-68,740 describe systems which comprise two different photostructurable layers, of which the lower layer, due to its structure and/or due to chemical additives, serves for improved adhesion. Japanese Preliminary Published Application No. 56-23,150 describes a lithographic plate which comprises a base material, a photostructurable adhesive and, thereon, a silicone rubber layer.

In all these cases, however, the adhesively embonded film comprises materials which, compared with polyimides, have to be called non-thermostable and which, in their processing properties, cannot be compared to polyimides. This is revealed, for example, by the fact that the layers to be applied require in all cases a support film, since before exposure they do not possess the good mechanical properties of the polyimide film.

The hitherto customary dry film resists are composed, before exposure, of relatively soft or of thermoplastic coating materials, so that an adhesive bond to a substrate or to an adhesive layer can be obtained significantly more easily.

The polyimide films, by contrast, have in some instances very high glass transition temperatures, in some cases up to over 400° C., and they form even before exposure extremely resistant chemically inert films.

These films are not self-adhesive, so that, for example, they can be wound directly and without use of separating films onto a roll.

On the other hand, the photocrosslinkable polyimide films are still dissolvable in certain solvents.

From the publications mentioned, therefore, no conclusion can be drawn whether and with which adhesive materials a photostructurable polyimide film can actually be adhesively bonded so that laminating and drying are not accompanied by bubble formation or destruction of the film, that a good reciprocal adhesive bond is guaranteed even at high temperatures (200°-400° C.), and that it can be ensured that all non-exposed portions of the coating are completely freely, crisply and residuelessly removable by development.

The present invention relates to a coated material containing in successive order
(a) a substrate which can bear a relief image on the surface and/or can be perforated,
(b) a photostructurable negative-working thermostable adhesive and
(c) a self-supporting photocrosslinkable polyimide film.

The term "self-supporting polyimide film" is understood as meaning a film which, unlike conventional dry film resists on an acrylate basis, can be prepared and processed without an additional support material. The minimum thickness of such a film generally depends on the particular film material and on the intended processing method. It can be determined by the skilled worker by way of routine experiments. In general, polyimide films of more than 3 μm in thickness are sufficiently stable for use as a film in the material according to the invention and in the process for preparing this material.

The preferred photocrosslinkable self-supporting polyimide film (c) has a thickness of 3-300 μm, preferably of 5-50 μm, particularly preferably 10-50 μm, and essentially comprises a homopolyimide or copolyimide which has 5 to 100 mol %, based on the total molecule, of at least one structural element of the formula Ia and 95-0 mol % of at least one structural element of the formula Ib, where the individual structural elements Ia and Ib can be different within a given polymer molecule

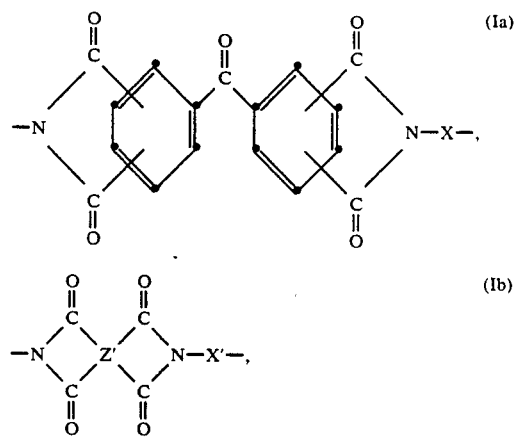

where the carbonyl groups in the formula Ia are in each case pairwise in ortho-position relative to each other, but preferably in the 3,3'4,4'-position of the benzophenone system, X is the divalent radical of an aromatic diamine, Z' is a tetravalent benzophenone radical or any other unsubstituted or substituted tetravalent aromatic radical to which are bonded two carbonyl groups each in ortho- or peri-position, and X' is defined in the same way as X or is the divalent radical, different from X, of an organic diamine, wherein the aromatic radical of X is substituted by alkyl, alkoxy, alkoxyalkyl or aralkyl in both ortho-positions relative to at least one N atom or at least in one ortho-position relative to both N atoms, or two adjacent C atoms of the aromatic radical X are substituted by alkylene, X and X' being different when Z' is a tetravalent benzophenone radical. Polyimides having the structural elements Ia and Ib are described in EP-A-No. 132,221.

Particularly preferred photocrosslinkable polyimide films (c) comprise essentially a homopolyimide or copolyimide, as defined above, in which at least 50 mol % of the polymer, based on the total molecule, comprise structural elements of the formula Ia, the radical Z' of the structural element of the formula Ib is selected from the group consisting of

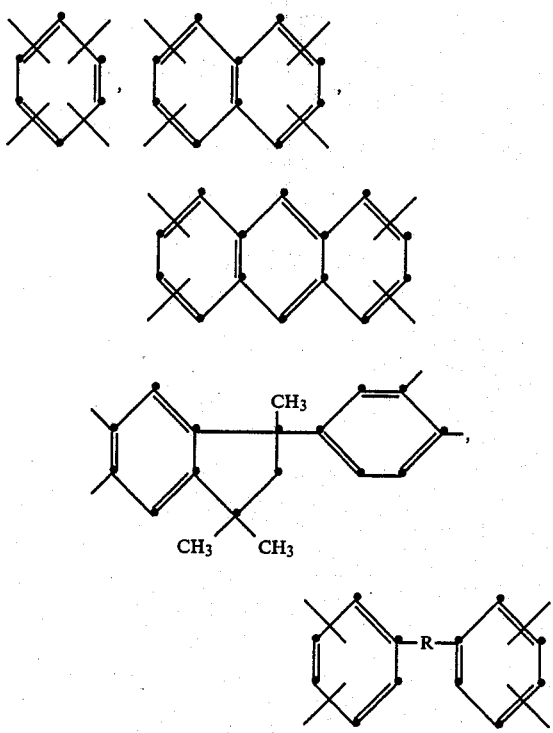

where the radicals Z' within a given molecule can take on different meanings, in which R is a direct bond or a bridge group of the formulae

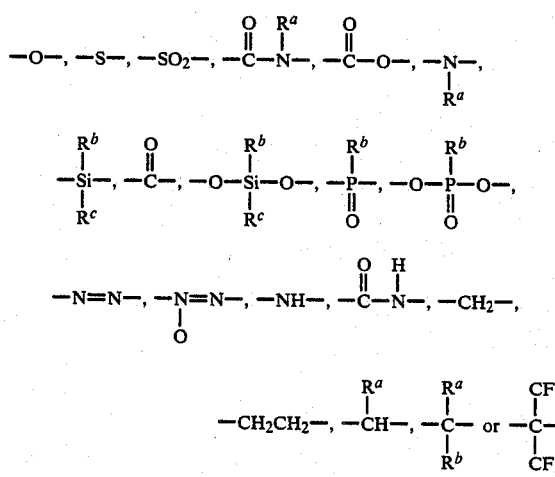

in which $R^a$, $R^b$ and $R^c$ are alkyl having 1 to 6 C atoms, phenyl or benzyl and $R^b$ and $R^c$ are also alkoxy having 1 to 6 C atoms, phenyloxy or benzyloxy, in which the radical X of structural element Ia is selected from the group of the following structures which can also be different within a given molecule

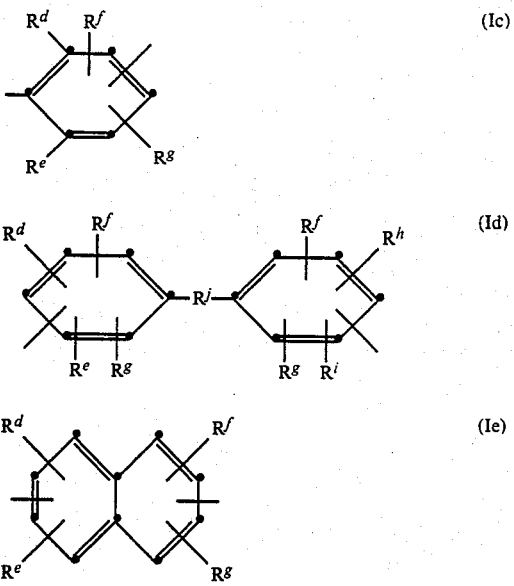

in which, in the formula Ic, the free bonds are in the meta- or or para-position relative to each other, in the formula Id the free bonds are preferably in the meta- or para-position relative to the $R^j$ group and $R^d$ and $R^e$ are bonded in the two ortho-positions relative to the free bond, and in the formula Ie the free bonds are bonded in the 2-, 3-, 6- and 7-position and $R^d$ and $R^e$ are situated in the two ortho-positions relative to the free bonds, $R^j$ is a direct bond, —O—, —S—, —SS—, —SO—, —SO$_2$—, —CO—, —COO—, —NH—, —N-alkyl having 1 to 6 C atoms in the alkyl,

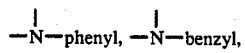

—CONH—, —CON-alkyl having 1 to 6 C atoms in the alkyl,

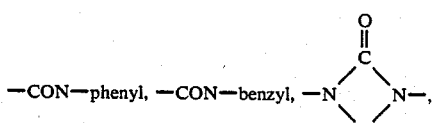

in which Y represents,

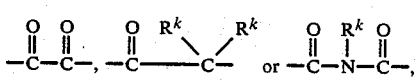

$R^k$ is a hydrogen atom, $C_1$–$C_6$alkyl or phenyl, or the group $R^j$ represents a linear or branched alkylene group having to 3 C atoms, alkylidene which has 2 to 12 C atoms and can be substituted by Cl or F, cycloalkylidene having 5 or 6 ring carbon atoms, phenylene, phenylenedioxy, or the group

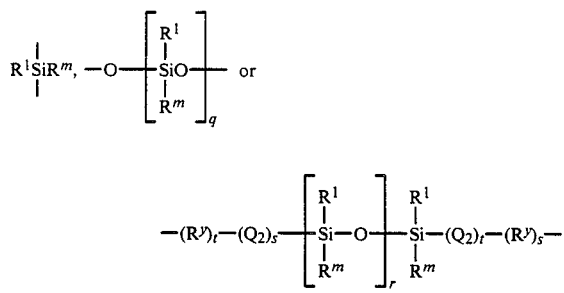

in which $R^1$ and $R^m$ are alkyl or alkoxy having 1 to 6 C atoms, phenyl, benzyl, phenyloxy or benzyloxy, r is a number from 1 to 10, t is 0 or 1 and s is 0 or 1, and $R^y$ is —O— or —S— and $Q_2$ is $C_1$-$C_6$-alkylene, and q is a number from 1 to 100, $R^d$ and $R^e$ are alkyl or alkoxy having 1 to 12 C atoms, alkoxyalkyl having 2 to 12 C atoms, cyclopentyl, cyclohexyl or benzyl or in the formulae Ic or Id, $R^d$ and $R^f$ are in adjacent positions and together are trimethylene or tetramethylene, and $R^e$ can also be a hydrogen atom, $R^f$ and $R^g$ are a hydrogen atom or independently are defined in the same way as $R^d$ and $R^e$, and $R^h$ and $R^i$ are a hydrogen atom, independently are defined as $R^d$ and $R^e$, or $R^f$ and $R^h$ in the formula Id together are trimethylene or tetramethylene, and in which the radical X' of the structural element Ib is defined in the same way as X or is selected from the group of structures, which can also be different within a given molecule, $C_2$-$C_{30}$alkylene, $C_5$-$C_8$cycloalkylene, $C_7$-$C_{30}$aralkylene, $C_6$-$C_{22}$arylene or polysiloxane.

Particularly preferred photocrosslinkable self-supporting polyimide films (c) are films having a thickness of 3–300 μm and comprising essentially a homopolyimide or copolyimide, as defined above, in which at least 50 mol %, based on the total molecule, comprise structural elements of the formula Ia, Z' is a radical of the formula

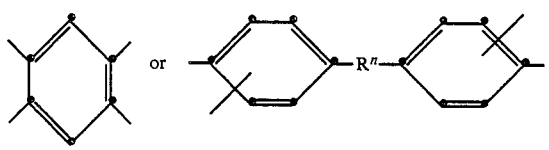

which can also be different within a given molecule, in which $R^n$ is a direct bond —O—, —$SO_2$—, —$CH_2$—, —$C(CF_3)_2$— and in particular —CO— in which the radical X is selected from the group consisting of

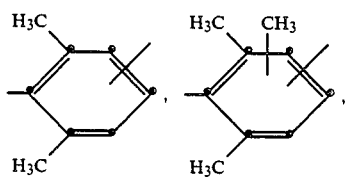

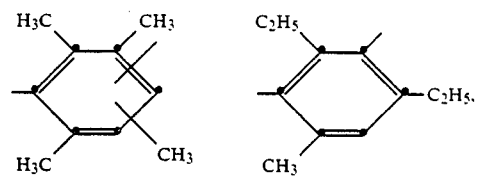

in which the free bonds are in the meta- or para-position relative to each other, or of the formula

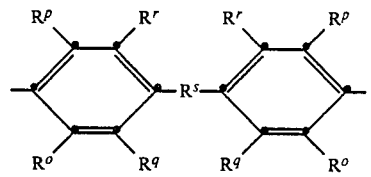

where these radicals can also take on different meanings within a given molecule, in which $R^o$ and $R^p$ are independently methyl, ethyl, n-propyl or isopropyl and $R^q$ and $R^r$ are a hydrogen atom or are defined in the same way as $R^o$ or $R^o$ and $R^q$ are together trimethylene or tetramethylene and $R^p$ and $R^r$ are a hydrogen atom, and $R^s$ is a direct bond, —$CH_2$—, —$C(CF_3)_2$—, 2,2-propylidene or —CO—, and in which the radical X' is defined in the same way as X or is selected from the group consisting of

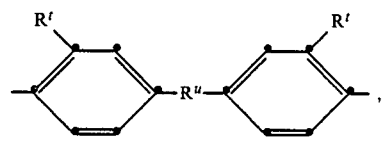

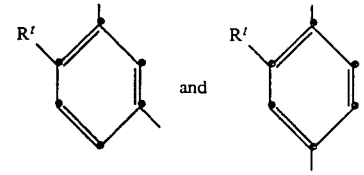

where these radicals can also take on different meanings within a given molecule, in which $R^u$ is a direct bond, —O—, —CO—, —$C(CF_3)_2$— or —$CH_2$—, and $R^t$ is methyl, ethyl, isopropyl, methoxy, ethoxy or a hydrogen atom. Further preferred film materials are photocrosslinkable self-supporting polyimide films of 3–300 μm, in particular 5–50 μm, and very particularly 10–50 μm, in thickness, which essentially comprise homopolyimides or copolyimides having an average molecular weight of at least 2000 and which contain at least 5 mol %, based on the polymer, of at least one structural element of the formulae IX or X

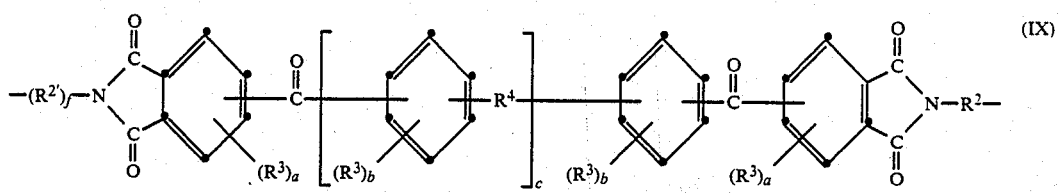

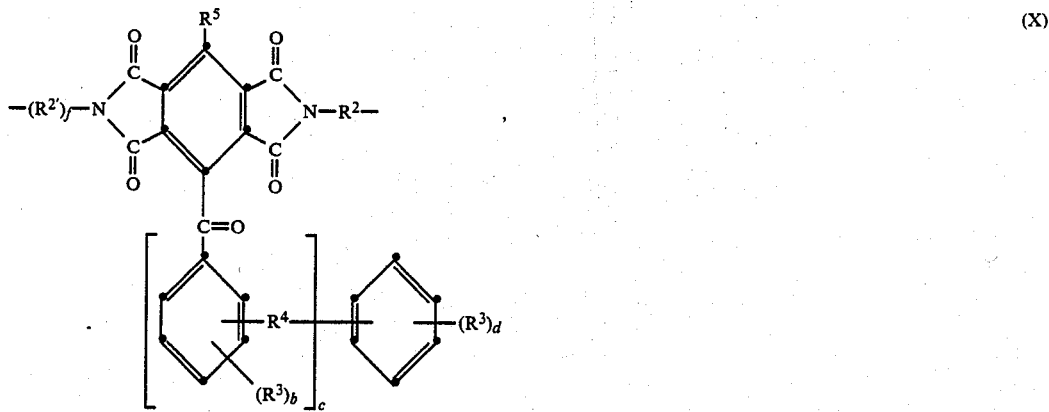

in which
- $R^3$ is halogen, nitro, $C_1$-$C_6$-alkyl, $C_1$-$C_6$-alkoxy, $C_1$-$C_6$-alkylthio, which can be substituted by phenyl, or is phenyl, phenoxy or phenylthio,
- $R^4$ is a direct bond or a bridge group,
- $R^5$ is a hydrogen atom or aroyl or is defined in the same way as $R^3$,
- a is 0, 1, 2 or 3, b is 0, 1, 2, 3 or 4, c and d are 0, 1, 2, 3, 4 or 5, f is 0 or 1, and, when a, b and d are 2, the two $R^3$ together can also be —CH=CH—CH=CH— bonded in the o-position, and
- $R^2$ and $R^{2'}$ are an unsubstituted or substituted cycloaliphatic or araliphatic radical, an aromatic radical where two aryl nuclei are linked via an aliphatic group, or an aromatic radical which is substituted by at least one alkyl group, cycloalkyl group, alkoxy group, alkoxyalkyl group, alkylthio group, alkylthioalkyl group, aralkyl group or, on two adjacent C atoms of the aromatic radical, by an alkylene group, $R^2$ being an aromatic radical which is substituted in the two ortho-positions relative to at least one N atom, when f is 0.

Polyimides having the structural elements IX and X are described in EP-A-No. 162,017.

Further interesting film materials are photocrosslinkable self-supporting polyimide films of 3–100 μm, particularly of 5–50 μm, very particularly of 10–50 μm, in thickness, which essentially comprise homopolyimides or copolyimides which contain structural elements of aromatic aminodicarboxylic acids, having an inherent viscosity of at least 0.1 dl/g, measured at 25° C. in a solution of 0.5% by weight of polyimide in N-methylpyrrolidone, which contain recurring structural elements of the formula XI

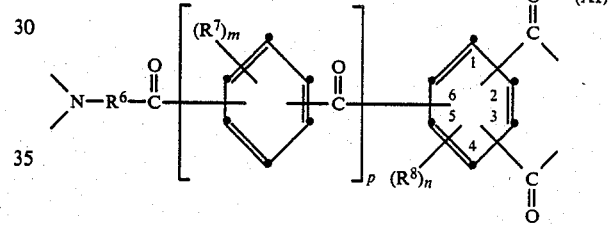

in which
- $R^7$ and $R^8$ are halogen, nitro, aryl, aryloxy, alkyl or alkoxy, m is 0 or a number from 1–4, n is 0 or a number from 1 to 3 and p is 0, 1 or 2, the free carbonyl groups are bonded in ortho-position relative to each other and $R^6$ is a divalent aromatic radical which is substituted by at least one alkyl group or aralkyl group.

Polyimides of this type are described in EP-A-No. 182,745.

The choice, composition and thickness of the thermostable photocrosslinkable adhesive (b) depend on the properties of the polyimide film to be adhesively embonded, but also on the particular demands on the coating. Parameters of the demand profile are for example nature and constitution of the surface (such as the material, roughness, topology), coating methods for the adhesive (such as application to the substrate or to the film to be adhesively embonded), and envisaged thermal, chemical and mechanical stresses (such as proposed temperatures, long-term or short-term exposure, thermal stress under oxidative (air) or nonoxidative conditions, mechanical stress at elevated temperatures or after the heat treatment, thermal stress with simultaneous exposure to aggressive chemicals).

The thermostable photocrosslinkable adhesive layer in the fully cured state has a thickness of, expediently, less than 25 μm, preferably of 0.01 to 25 μm.

The thickness of the adhesive layer is in general distinctly less than the thickness of the polyimide film to be applied, and in the fully cured state preferably amounts to no more than a quarter of the total layer thickness; this applies in particular when the thermostable adhesive comprises a material which is less stable than the superposed polyimide film.

If the thermostable adhesive comprises a material which is as stable as or more stable than the superposed polyimide film, the thickness of the adhesive layer can also be comparable to the thickness of the polyimide film.

If desired, the adhesive contains a solvent which is evaporated after the coating process. This can take place at elevated temperature.

It has further been found that the present polyimides, in particular through the choice of suitable diamines or diamine mixtures, can be graduated in their solubility behaviour in such a way that components, including in particular solvents for the adhesive, can be provided so that the surface of the polyimide film is only dissolved incipiently, but that the film itself cannot be destroyed during the laminating step. As a result it is possible in particular to obtain an intimate bond between the film and the adhesive layer.

It is also possible to coordinate the solubility properties in such a way that volatile components of the adhesive layer, for example the solvent, can, under suitable drying conditions, diffuse through the superposed polyimide layer without thereby impairing the quality of the whole coating.

Preference is given further to those photostructurable negative-working thermostable adhesives which, after exposure, enter even at a temperature of less than 70° C. a firm bond with the superposed exposed film in the exposed areas.

Preferred adhesives (b) are:
(b1) photocrosslinkable polyimides which are soluble in organic solvents and which can, if desired, be present in combination with organic chromophoric polyazides; and/or
(b2) photocrosslinkable polyamidic acids or their esters; and/or
(b3) photocrosslinkable organopolysilsesquioxanes; and/or
(b4) photocrosslinkable polyamide-imides; and/or
(b5) photocrosslinkable epoxy systems; and/or
(b6) photocrosslinkable systems which contain compounds having ethylenically unsaturated groups which can undergo free radical polymerization.

Particular preference is given to the adhesives of types (b1), (b3), (b5) and (b6).

By taking into account compatibility and the various mechanisms of the photo reaction, it is also possible to use mixtures of these different adhesives.

Particular preference is given to the use as adhesive (b1) of a solution of polyimides or a mixture of polyimides as already described above as materials for preparing the photocrosslinkable self-supporting film.

In addition to the compounds already described, it is also possible to use here strongly light-absorbing, photocrosslinkable polyimides. Using these compounds as film materials is, depending on the thickness of the film, less preferable, since, owing to the strong light absorption in the upper zones of the film, photocrosslinking problems are likely in the lower zones. Yet, these compounds are extremely suitable for use as adhesive material which is preferably applied in comparatively thin layers.

This type includes photocrosslinkable polyimides which essentially comprise a homopolymer or copolymer which is derived from at least one aromatic tetracarboxylic acid and at least one diamine and essentially contains 0.1 to 100 mol % of at least one structural element of the formula II

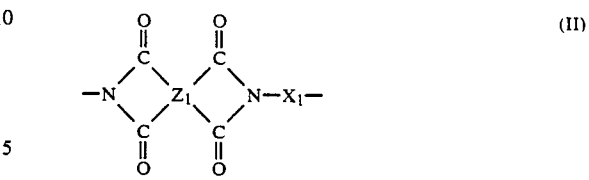

and 99.9 to 0 mol % of at least one structural element of the formulae III and/or IV

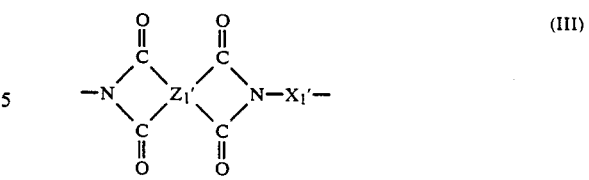

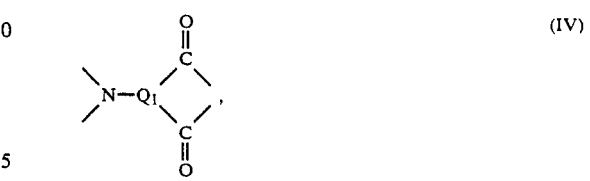

in which $Z_1$ is at least one tetravalent radical of the formulae V, VI, VII or VIII

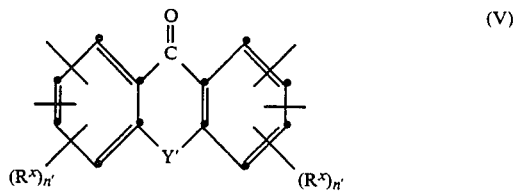

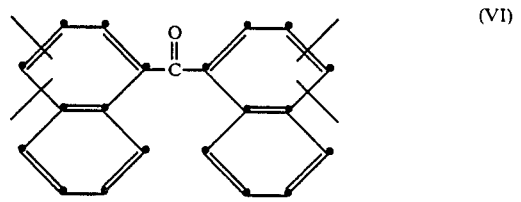

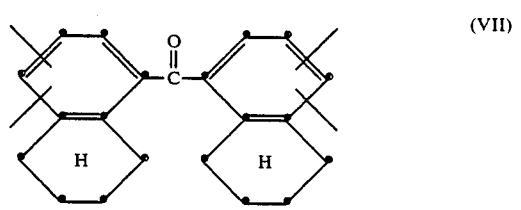

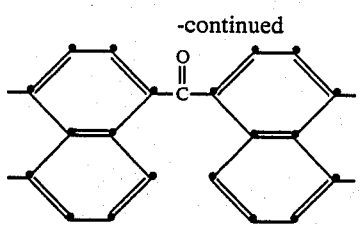

(VIII)

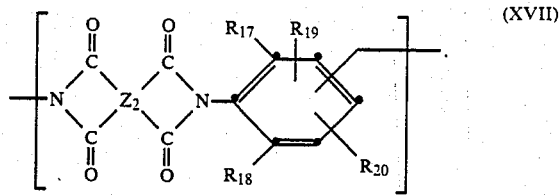

(XVII)

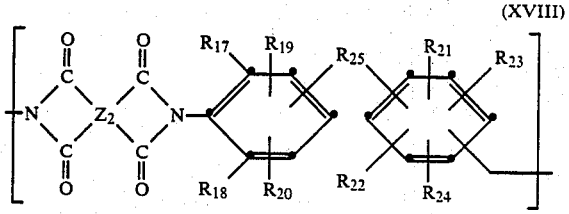

(XVIII)

in which the free bonds are bonded in the ortho-position relative to each other and Y' is a direct bond, —CH$_2$—, —(CH$_2$)$_2$—, —O—, —S—, —SO—, —SO$_2$—, —CO—, —NR—$^v$ or —CR$^v$R$^w$—where R$^v$ is a hydrogen atom, C$_1$-C$_{10}$-alkyl, phenyl, naphthyl or phenyl(C$_e$H$_{2e}$)— where e is 1 to 4 and R$^w$ is defined in the same way as R$^v$ except that it is not a hydrogen atom, R$^x$ is C$_1$-C$_{10}$-alkyl, halogen, —CN, —NO$_2$, C$_1$-C$_{12}$-alkoxy, phenoxy, naphthoxy or phenyl-(C$_e$H$_{2e}$)— where e is 1-4, n' is 0, 1 or 2, X$_1$ is an unsubstituted or substituted heterocyclic, cycloaliphatic or araliphatic radical, an aromatic radical where two aryl nuclei are linked via an aliphatic group, or an aromatic radical which is substituted by at least one alkyl group, cycloalkyl group, alkoxy group, alkoxyalkyl group, alkylthio group, alkylthioalkyl group, hydroxyalkyl group, hydroxyalkoxy group, hydroxyalkylthio group, aralkyl group or, on two adjacent C atoms of the aromatic radical, by an alkylene group, Q$_1$ is a trivalent aromatic radical, Z$_1$' is defined in the same way as Z$_1$ or is a tetravalent organic radical different from Z$_1$, and X$_1$' is the divalent radical, different from X$_1$, of an organic diamine, where Z$_1$ in formula II can also be tetravalent benzophenone radicals if structural elements of the formula IV are present.

Such compounds were described in EP-A-No. 181,837.

A further type of preferably usable photocrosslinkable thermostable adhesives (b1) is a mixture which, in addition to customary additives which can, if desired, be present, contains (a) a homopolyimide or copolyimide of aromatic tetracarboxylic acids and aromatic diamines or aromatic and aliphatic diamines which is soluble in organic solvents, at least one aliphatic group being bonded directly or via a bridge group to at least a portion of the tetracarboxylic acid radicals, of the aromatic diamine radicals or of the two radicals, and/or at least a portion of these radicals containing, as aliphatic bridge group, alkylene, alkylidene, cycloalkylidene or Si(alkyl)$_2$, and (b) at least 0.1% by weight, based on the polyimide component, of at least one organic chromophoric polyazide in which the azide groups are bonded directly or via an SO$_2$ group to aromatic hydrocarbon radicals.

Such mixtures are described in EP-A-No. 92,524.

A particularly preferred photocrosslinkable thermostable adhesive (b1) is a mixture which, in addition to customary additives which can, if desired, be present, contains (a) a homopolyimide or copolyimide which is soluble in an organic solvent and in which the polymer essentially comprises 50 to 100 mol % of recurring structural elements of formulae XVII and/or XVIII and 50 to 0 mol % of recurring structural elements of the formula XIX

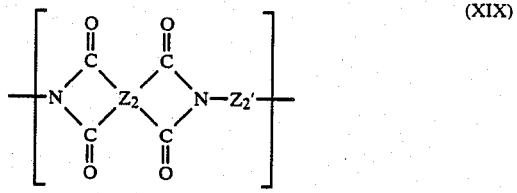

(XIX)

where in the formulae XVII, XVIII and XIX the four carbonyl groups are bonded to different carbon atoms and two carbonyl groups each are in ortho- or peri-position relative to each other, Z$_2$ is a tetravalent radical which contains at least one aromatic ring, Z$_2$' is a divalent organic radical which differs from the groups

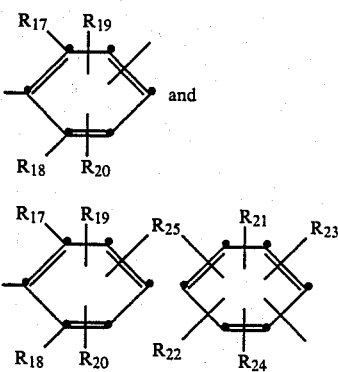

and is selected from among aromatic, alkylaromatic, aliphatic, cycloaliphatic and heterocyclic radicals, combinations thereof and radicals with oxygen-, sulfide-, nitrogen-, silicon-or phosphorus-containing bridge groups, R$^{17}$ and R$^{18}$ independently of each other are alkyl with 1-4 C atoms, R$_{19}$, R$_{20}$, R$_{21}$, R$_{22}$, R$_{23}$ and R$_{24}$ independently of one another are hydrogen or alkyl having 1-4 C atoms and R$^{25}$ is a direct bond, —O—, —S—, —SO—, —SO$_2$—, —CO—, —CH$_2$—, —C(CF$_3$)$_2$—, cycloalkylidene having 5-6 ring carbon atoms, phenylene,

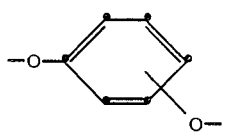

or a group

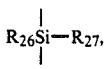

in which $R_{26}$ and $R_{27}$ are alkyl or alkoxy each having 1-6 C atoms, phenyl, benzyl, phenyloxy or benzyloxy and (b) at least 0.1% by weight, based on the polyimide component, of at least one organic chromophoric polyazide in which the azide groups are bonded directly or via an $SO_2$ group to aromatic hydrocarbon radicals.

Such mixtures are described in EP-A-No. 141,781.

Further useful photostructural polyimides which can be used as adhesives (b1) are described in Japanese Patent No. 84-108,031 and Japanese Preliminary Published Application No. 57-143,329.

Polyamidic acids based on aliphatic or preferably alicyclic tetracarboxylic acids or their anhydrides and diamine compounds which can be used, in combination of compounds which can undergo crosslinking reactions under the action of actinic radiation and which can likewise be preferably used as adhesives (b2) are described in Japanese Preliminary Published Application No. 59-100,135.

Organopolysilsesquioxanes which are preferably used as adhesives of type (b3) are ladder polymers having the recurring structural element of the formula XXXI

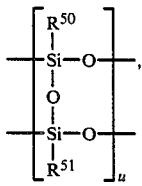

in which $R^{50}$ and $R^{51}$ are monovalent hydrocarbon radicals and u is a positive whole number, preferably greater than 30. Organopolysilsesquioxanes of the formula XXXI in which the radicals $R^{50}$ and $R^{51}$ are lower alkyl and at least some of these radicals are ethylenically unsaturated are described in EP-A-No. 76,656. Said publication also describes mixtures of these compounds with a crosslinking agent, for example an azide compound, and their use as highly heatstable photocrosslinkable surface-coating agents for producing relief images.

The thickness of the adhesive layers of type (b3) is in general no more than 5 μm.

Japanese patent No. 83-96,654 describes photocrosslinkable mixtures of an organopolysilsesquioxane and an aromatic azide or sulfonyl azide. The organic radicals in these siloxanes need not have unsaturated groups.

The preparation of organopolysilsesquioxanes is described for example in EP-A-No. 46,695.

For the purposes of the present invention, heatstable photocrosslinkable adhesives (b3) are preferably mixtures of (a) an organopolysilsesquioxane XXXI in which $R^{50}$ and $R^{51}$ independently of each other are monovalent hydrocarbon radicals, preferably alkyl radicals, particularly preferably $C_1$-$C_4$alkyl, or are aromatic radicals which can be substituted by $C_1$-$C_4$alkyl, and u is a whole number greater than 30, and (b) an aromatic azide or sulfonyl azide.

A further group of compounds which are preferably usable as adhesives (b4) are linear saturated homopolycondensates or copolycondensates from the group of the polyamideimides having benzophenonetricarboxylic acid radicals with at least one recurring structural element of the formula XII

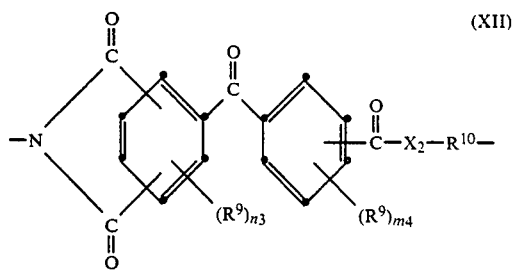

and in the case of copolycondensates additionally recurring structural elements of the formulae XIII and/or XIV

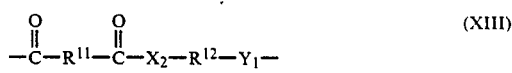

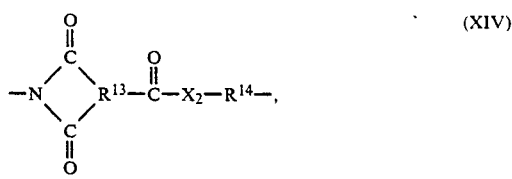

in which the imide group in structural element XII is bonded to two adjacent C atoms, $m_4$ is 0 or a number from 1 to 4 and $n_3$ is 0 or a number from 1 to 3, $X_2$ is —S—, —O— or —$NR^{15}$— and $Y_1$ independently is defined in the same way as $X_2$, $R^9$ is alkyl or alkoxy having fewer than 6 C atoms, aryl having 6 to 10 C atoms, aralkyl having 7 to 10 C atoms or halogen, $R^{12}$ is an unsubstituted or substituted divalent aliphatic, cycloaliphatic, araliphatic or aromatic radical, and if $X_2$ and $Y_1$ are the group —$NR^{15}$—, $R^{12}$ and one of the $R^{15}$ are together alkylene having 5 to 7 C atoms to which the second —$NR^{15}$— group is bonded, or $R^{12}$ is methylene, ethylene or propylene and the two $R^{15}$ of the $NR^{15}$ groups are together ethylene or propylene or $X_2$ or $Y_1$ are —S— or —O— and the other '$NR^{15}$—, $R^{12}$ and $R^{15}$ together are alkylene having 5-7 C atoms to which the group —O— or —S— is bonded, $R^{10}$ is an unsubstituted or substituted divalent aliphatic or aromatic hydrocarbon radical, $R^{14}$ is independently defined in the same way as $R^{10}$, $R^{11}$ is a divalent saturated aliphatic or aromatic radical, $R^{13}$ is a trivalent saturated aliphatic or aromatic radical in which the imide group is bonded to two adjacent C atoms and $R^{15}$ is a hydrogen atom, alkyl, cycloalkyl, aryl, aralkyl or alkaralkyl, the copolycondensates containing the structural elements of the formula XII in an amount of at least 10 mol %, based on the copolycondensate.

The monopolyamide-imides and copolyamide-imides of this group are described in EP-A-No. 138,768. Also suitable for use as adhesives (b4) are mixtures of polyamide-imides having unsaturated groups and a photosensitizer, which are described in U.S. Pat. No. 4,180,404.

Also of interest for use as adhesives (b5) are photocrosslinkable epoxy resins or mixtures of such resins.

Such adhesive mixtures preferably contain
(a) an aromatic, cycloaliphatic or araliphatic compound which contains at least one 1,2-epoxy group, or a mixture of such compounds,
(b) at least one photoinitiator suitable for the photocrosslinking of epoxy resins, if desired in combination with a photoaccelerant and, if desired,
(c) at least one aromatic, cycloaliphatic or araliphatic compound usable as latent hot-curing agent.

Radiation-activatable photoinitiators which are suitable for crosslinking epoxy resins are a plurality of different cationic compounds which have been disclosed and described for example in Brit. Polymer J. 15, pages 24 et seq. (1983) and J. Macromol. Sci. Macromol. Rev. C21, pages 187 et seq. (1981).

High suitability is possessed by onium salts, in particular those with low-nucleophilicity anions. Such anions are for example the halogen complex anions of divalent to heptavalent metals or non-metals, for example Sb, Sn, Fe, Bi, Al, Ga, In, Ti, Zr, Sc, V, Cr, Hf and Cu and also B, P and As. The halogen is preferably F. Examples are $BF_4^-$, $PF_6^-$, $AsF_6^-$, $SbF_6^-$.

Examples of suitable onium salts are aryldiazonium salts and onium salts of groups Va, VIa, VIIa of the Periodic Table of Elements, for example halonium salts, in particular aromatic iodonium and iodoxonium salts, quaternary ammonium, phosphonium and arsonium salts, aromatic sulfonium salts and sulfoxonium salts and selenonium salts (compare EPA-A No. 153,904).

Preferred halonium salts are those of the formula XXXIII

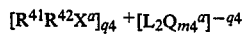  XXXIII in which $R^{41}$ and $R^{42}$ independently of each other are a carbocyclic or heterocyclic aromatic radical having 6 to 20 C atoms or $R^{41}$ and $R^{42}$ together are a divalent carbocyclic or heterocyclic aromatic radical, $X^a$ is a halogen atom, $m_4$ is a number which is equal to the total of the valencies of $L_2$ and $q_4$, $L_2$ is a divalent to heptavalent metal or non-metal and $Q^a$ is a halogen atom, and $q_4$ is a number from 1 to 3.

A further preferred group of onium salts are iodosyl salts of the formula XXXIV

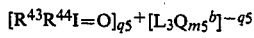  XXXIV, in which $R^{43}$ and $R^{44}$ are a carbocyclic or heterocyclic aromatic radical having 6 to 20 C atoms, $m_5$ is a number which is equal to the total of the valencies of $L_3$ and $q_5$, $L_3$ is a divalent to heptavalent metal or non-metal and $Q^b$ is a halogen atom, and $q_5$ is a number from 1 to 3.

Further preferred groups of onium salts are sulfonium salts of the formula XXXV

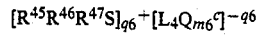  XXXV.

in which $R^{45}$, $R^{46}$ and $R^{47}$ independently of one another are a carbocyclic or heterocyclic aromatic radical having 6 to 20 C atoms or one of $R^{45}$, $R^{46}$ and $R^{47}$ is this aromatic radical and the other two together are a divalent carbocyclic or heterocyclic aromatic radical, $m_6$ is a number which is equal to the sum of the valencies of $L_4$ and $q_6$, $L_4$ is a divalent to heptavalent metal or non-metal and $Q^c$ is a halogen atom, and $q_6$ is a number from 1 to 3.

The iodonium salts are described for example in DE-A-No. 2,518,639 or EP-A-No. 104,143. Particular preference is given to diphenyliodonium hexaluorophosphate.

Suitable sulfoxonium salts are described for example in U.S. Pat. Nos. 4,383,025, 4,398,014 and 4,299,938 or EP-A-No. 35,969.

Further suitable photoinitiators are metal carbonyl compounds, metallocenes and metallocene carbonyl complexes.

The particularly preferred groups of suitable cationic photoinitiators for the photocrosslinking of epoxy resins include (I) salts of the formula XXVIII $$[Y_3-Q-(CO)_{a1}]^+ MX_{4n1}^- \qquad (XXVIII),$$

in which $Y_3$ is an arene group or dienylium group, Q is an atom of a transition metal selected from among titanium, vanadium, chromium, manganese, iron, cobalt, nickel, copper, niobium, molybdenum, ruthenium, rhodium, palladium, silver, tantalum, tungsten, rhenium, osmium, iridium, platinum and gold, $a_1$ is a positive whole number such that the atom Q has a complete electron shell configuration, M is an atom of a metal or non-metal, $n_1$ 4, 5 or 6 and larger by unity than the valency of M and $X_4$ is a fluorine or chlorine atom, with the proviso that, when M is antimony, $n_1$ is 6 and five of the symbols $X_4$ are fluorine, and one can also be a hydroxo group; or (II) salts of the formula XXIX

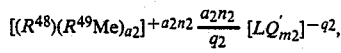  (XXIX)

in which $a_2$ is 1 or 2 and $n_2$ and $q_2$ independently of each other are each a whole number from 1 to 3, Me is the cation of a monovalent to trivalent metal from the group IVb to VIIb, VIII or Ib of the periodic table of the elements, $m_2$ is a whole number equal to the valency of L and $q_2$ and Q' is a halogen atom, L is a divalent to heptavalent metal or non-metal, $R^{48}$ is a π-arene and $R^{49}$ is a π-arene or the anion of a π-arene. In particular the salts of formula XXIX are used as photoinitiators.

A particularly preferred embodiment of the photoinitiators XXIX are iron compounds of the formula XXX

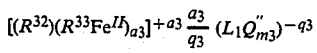  (XXX)

in which
$a_3$ is 1 or 2 and $q_3$ is 1, 2 or 3, $L_1$ is a divalent to heptavalent metal or non-metal,
$Q''$ is a halogen atom,
$m_3$ is a whole number which is equal to the total of the valencies of $L_1$ and $q_3$,
$R^{32}$ is a $\pi$-arene and $R^{33}$ is the anion of a $\pi$-arene. The compounds of the formula XXX are generally used together with at least one electron acceptor as oxidizing agents and/or if desired together with a sensitizer for the compound of the formula XXX.

By combining photoinitiators of the formula XXX with suitable oxidizing agents it is possible to formulate radiation-curing agents which are for use with epoxy compounds and which even on irradiation with actinic radiation lead to adequate curing of the resin and require no thermal postcure.

The epoxy adhesives which contain photoinitiators of the formulae XXVIII and XXIX are described in EP-A-Nos. 94,914 and -94,915. Epoxy adhesives which contain photoinitiators of formula XXX in combination with oxidizing agents and/or with sensitizers are described in EP-A-Nos. 126,712 and -152,377. The photoinitiators mentioned as preferred in these patent applications can also preferably be used for the purposes of this invention in adhesives (b).

Particularly preferred adhesives (b5) are epoxy resins which contain, as photoinitiator, a combination of iron compounds of the formula XXX with oxidizing agents.

The aromatic, cycloaliphatic or araliphatic compounds which contain at least one 1,2-epoxy group and are suitable for use as component (a) in the adhesives of the coatings according to the invention include, for example, glycidyl ethers of monohydric cycloaliphatic or araliphatic alcohols or phenols, such as phenyl glycidyl ethers, and glycidyl esters of cycloaliphatic, aromatic or araliphatic monocarboxylic acids.

Preferably (a) is an epoxy resin having at least one medial epoxy group or a cycloaliphatic, aromatic or araliphatic epoxy resin which contains on average more than one 1,2-epoxy group per molecule and which contains as 1,2-epoxy group more than one terminal group which is bonded directly to an oxygen atom or nitrogen atom, but preferably oxygen atom, and has the formula

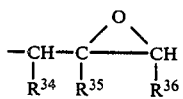

XXXII in which either $R^{34}$ and $R^{36}$ are each a hydrogen atom, when $R^{35}$ is then a hydrogen atom or a methyl group, or $R^{34}$ and $R^{36}$ together are —CH$_2$CH$_2$—, when $R^{35}$ is then a hydrogen atom.

Examples of such resins are polyglycidyl and poly($\beta$-methylglycidyl) esters which are obtainable by reacting a cycloaliphatic, aromatic or araliphatic compound which contains two or more carboxylic acid groups per molecule with epichlorohydrin, glyceroldichlorohydrin or $\beta$-methylepichlorohydrin in the presence of alkali. Such polyglycidyl esters can be derived from cycloaliphatic polycarboxylic acids, such as tetrahydrophthalic acid, 4-methyltetrahydrophthalic acid, hexahydrophthalic acid and 4-methylhexahydrophthalic acid, and also from aromatic polycarboxylic acids, such as phthalic acid, isophthalic acid and terephthalic acid.

Further examples are polyglycidyl and poly($\beta$-methylglycidyl) ethers which are obtainable by reacting a compound which contains at least two free alcoholic and/or phenolic hydroxyl groups per molecule with the corresponding epichlorohydrin under alkaline conditions, or even in the presence of an acid catalyst with subsequent alkali treatment. These ethers can be prepared from cycloaliphatic alcohols, such as 1,3- and 1,4-cyclohexanediol, bis-(4-hydroxycyclohexyl)methane, 2,2-bis-(4-hydroxycyclohexyl)-propane and 1,1-bis-(hydroxymethyl)-cyclohex-3-ene, and from alcohols having aromatic nuclei, such as N,N-bis-(2-hydroxyethyl)-aniline and p,p'-bis-(2-hydroxyethylamino)-diphenylmethane. They can further be prepared from mononuclear phenols, such as resorcinol and hydroquinone, and polynuclear phenols, such as bis-(4-hydroxyphenyl)-methane (otherwise known as bisphenol F), 4,4'-dihydroxydiphenyl, bis-(4-hydroxyphenyl)sulfone, bis-(4'-hydroxyphenyl)-bis-trifluoromethyl-methane, 1,1,2,2-tetrakis-(4-hydroxyphenyl)-ethane, 2,2-bis-(4-hydroxyphenyl)-propane (otherwise known as bisphenol A), 2,2-bis-(3,5-dibromo-4-hydroxyphenyl)-propane or tetrachlorinated or tetrabrominated bisphenol A, and also novolaks formed from aldehydes, such as formaldehyde, acetaldehyde, chloral and furfural with phenol itself or with phenol which is ring-substituted by chlorine atoms or alkyl groups having up to 9 carbon atoms each, such as 4-chlorophenol, 2-methylphenol and 4-tert.-butylphenol.

Poly-(N-glycidyl) compounds are likewise eligible, for example N-glycidyl derivatives of cycloaliphatic, aromatic amines, such as aniline, bis-(4-aminophenyl)-methane and bis-(4-methylaminophenyl)-methane, triglycidyl isocyanurate and N,N'-diglycidyl derivatives of hydantoins such as 5,5'-dimethylhydantoin.

Examples of epoxy resins having groups of the formula XXXII in which $R^{34}$ and $R^{36}$ together are a —CH$_2$CH$_2$— group are bis-(2,3-epoxycyclopentyl) ether, 2,3-epoxycyclopentyl glycidyl ether and 1,2-bis-(2,3-epoxycyclopentyloxy)-ethane.

Also eligible are epoxy resins in which some or all epoxy groups are in a medial position, such as vinylcyclohexene dioxide, limonene dioxide, dicyclopentadiene dioxide, 4-oxatetracyclo[6.2.1.0$^{2,7}$.0$^{3,5}$]undec-9-yl glycidyl ether, 1,2-bis-(4-oxatetracyclo[6.2.1.0$^{2,7}$.0$^{3,5}$]undec-9-yloxy)ethane, the 3,4-epoxycyclohexylmethy ester of 3',4'-epoxycyclohexanecarboxylic acid and also its 6,6'-dimethyl derivative, the bis-(3,4-epoxycyclohexanecarboxylic acid ester) of ethylene glycol, the bis-adipinic acid ester of 3,4-epoxy-6-methylcyclohexanemethylol or 3-(3,4-epoxycyclohexyl)-8,9-epoxy-2,4-dioxaspiro[5.5]undecane.

If desired it is possible to use epoxy resin mixtures.

The preferred epoxy resin component in adhesives (b5) of the coated materials according to the invention is in particular diglycidyl ethers of dihydric phenols, which can, if desired, be advanced and which are derived, for example, from 2,2-bis-(4-hydroxyphenyl)-propane or from bis-(4-hydroxyphenyl)-methane.

These can be monomers, oligomers or preferably low molecular weight polymers having an average molecular weight $M\omega$ of about 1,000 to 10,000. The preferred molecular weight is 1,000 to 6,000.

Very highly suitable epoxy compositions are those which can be simply transferred from an intermediate to a substrate.

These are for example glycidyl ethers of novolaks from substituted or unsubstituted phenols, such as xylenol, cresol, resorcinol, and in particular phenol and aldehydes, for example acetaldehyde and in particular formaldehyde.

The epoxy adhesives (b5) can have incorporated further customary additives, for example fillers, adhesion promoters, flame retardants, dyes, in particular antihalo dyes, which have no adverse effect on the action of the initiators, and sensitizers. Examples of sensitizers are:

1-chloranthracene, 2-methylanthracene, anthracene, pyrene, benzil, thioxanthone, 2-isopropylthioxan thone, 2-chlorothioxanthone, 3-thiophenylphthalimide, N-methyl-4-thiophenylphthalimide, benzyldimethyl ketal or benzildiethyl ketal.

Preference is given to thioxanthones, phthalimide thioethers and in particular anthracenes. These are preferably added in an amount of 0.1-10% by weight, preferably 0.1-5% by weight, based on the epoxy resin.

When $Y_3$ in the photoinitiator of formula XXVIII is an arene group, it will normally be necessary to use not only heat but also actinic radiation to obtain curing, if the epoxy groups in (a) are of the formula XXXII; with these salts, the use of epoxy resins having 1,2-epoxy groups which are directly bonded to cycloaliphatic carbon atoms is preferred.

In a further preferred embodiment, the photostructurable epoxy adhesive (b5) contains a curing amount of a latent hot-curing agent for the epoxy resin for the formation of a B-stage product. Complete curing of the adhesive composition is then obtained by heating.

Suitable heat-activatable crosslinking agents for the epoxy resin compositions include in particular polycarboxylic anhydrides, such as phthalic anhydride, hexahydrophthalic anhydride or even etherified phenolic resins.

The temperature and duration of heating required for hot curing and also the amounts of heat-activatable curing agent can be easily determined by means of routine experiments and are readily derivable from the well-known facts about hot-curing of epoxy resins.

Finally, the epoxy-based photostructurahle thermostable adhesives (b5) can also have added to them reactive diluents. Examples thereof are diallyl phthalate, diallyl carbonate, triallyl isocyanate, triallyl cyanurate or o-cresyl glycidyl ether.

. It is likewise preferable to use as adhesive (b5) a photocrosslinkable and subsequently still curable epoxy resin based on bisphenol diglycidyl ethers, which, in addition to free epoxy groups, still contains photocrosslinkable radicals

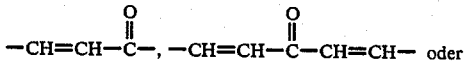, oder

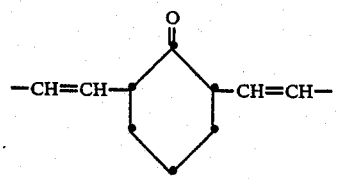

which are present in an amount of at least 10 mol %, based on the bisphenol units, as bridges between the aromatic nuclei of the bisphenol.

Such compounds have been described for example by R. Darms in Chimia 38, 13 (1984). The processes for preparing compounds of this type are indicated in German Offenlegungsschrift No. 2,947,734.

The suitable adhesives b6) from the group of compounds having ethylenically unsaturated groups which can undergo free radical polymerization, as defined above, can be divided into three classes.

It is thus possible to use (A) mixtures which contain
 (a) at least one ethylenically unsaturated compound which can undergo free radical polymerization and has a boiling point above 100° C. under atmospheric pressure,
 (b) at least one organic, inorganic or organometallic photoinitiator which, on irradiation, forms free radicals, and
 (c) a polymeric binder; or to use (B) mixtures which contain
 (a) compounds or mixtures of compounds having not only at least one medial epoxy group and/or at least one structural element of the formula XXXII, preferably at least one structural element of the formula XXXII

which is bonded terminally directly to an oxygen atom or nitrogen atom, but preferably oxygen atom, in which $R^{34}$ and $R^{36}$ are each a hydrogen atom, when $R^{35}$ is then a hydrogen atom or a methyl group, or $R^{34}$ and together are $-CH_2-CH_2-$, when $R^{35}$ is then then a hydrogen atom, but also having at least one ethylenically unsaturated double bond in a molecule,
 (b) at least one photoinitiator which, on irradiation, forms free radicals, and
 (c) if desired polymeric binders and/or a heat-activatable polyermizing agent for 1,2-epoxy resins and/or photosensitizers or photoinitiators for epoxy polymerization; or use (C) mixtures which contain
 (a) an epoxy resin having at least one medial epoxy group and/or at least one epoxy group of the formula XXXII, as defined above,
 (b) a compound which can undergo free radical photopolymerization, and if desired
 (c) a heat-activatable curing agent for the epoxy resin.

The polymeric binder of the mixtures of type (A) generally accounts for at least 20% by weight of the total composition and essentially determines the thermal and mechanical properties of the adhesive coatings.

Mixtures of this type are known and find utility in particular as soldering masks. Such systems and their use as photoresists are described for example in U.S. Pat. Nos. 3,469,982, 4,195,997 and 4,278,752.

The mixtures of types (A), (B) and (C) can, if desired, also contain further additives customary per se, for example adhesion promoters, fillers, reaction accelerants, low molecular weight or polymeric crosslinking agents or flame retardants, for example $Sb_2O_3$. The mixtures of types (B) and (C) can in addition also contain catalysts for thermal curing, for example diazabicyclooctane.

The ethylenically unsaturated compounds which can undergo free radical polymerization and which can be used in mixtures of type (A) are in particular allyl compounds, and acrylates and especially methacrylates.

Examples thereof are N,N-diethylaminoethyl acrylate, ethylene glycol diacrylate, 1,4-butanediol diacrylate, diethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, 2,2-di-(p-hydroxyphenyl)-propane diacrylate, pentaerythritol tetraacrylate, 2,2-di-(p-hydroxyphenyl)propane dimethacrylate, triethylene glycol diacrylate, polyoxyethyl-2,2-di-(p-hydroxyphenyl)-propane dimethacrylate, di-(3-methacryloxy-2-hydroxypropyl) ether of bisphenol-A, di-(2-methacryloxyethyl) ether or bisphenol-A, di-(3-acryloxy-2-hydroxypropyl) ether of bisphenol-A, di-(2-acryloxyethyl) ether of bisphenol-A, di-(3-methacryloxy-2-hydroxypropyl) ether of tetrachlorobisphenol-A, di-(2-methacryloxyethyl) ether of tetrachlorobisphenol-A, di-(3-methacryloxy-2-hydroxypropyl) ether of tetrabromobisphenol-A, di-(2-methacryloxyethyl)-ether of tetrabromobisphenol-A, di-(3-methacryloxy-2-hydroxypropyl) ether of 1,4-butanediol, di-(3-methacryloxy-2-hydroxypropyl) ether of 4,4′-dihydroxybiphenyl, triethylene glycol dimethacrylate, polyoxypropyltrimethylolpropane triacrylate, ethylene glycol dimethacrylate, butylene glycol dimethacrylate, 1,3-propanediol dimethacrylate, 1,2,4-butanetriiol trimethacrylate, 2,2,4-trimethyl-1,3-pentanediol dimethacrylate, pentaerythriol trimethacrylate, 1-phenylethylene 1,2-dimethacrylate, pentaerythriol tetramethacrylate, trimethylolpropane trimethacrylate, 1,5-pentanediol dimethacrylate, diallyl fumarate, styrene, 1,4-benzenediol dimethacrylate, 1,4-diisopropenylbenzene, 1,3,5-triisopropenylbenzene, and also in particular the compounds of the formula

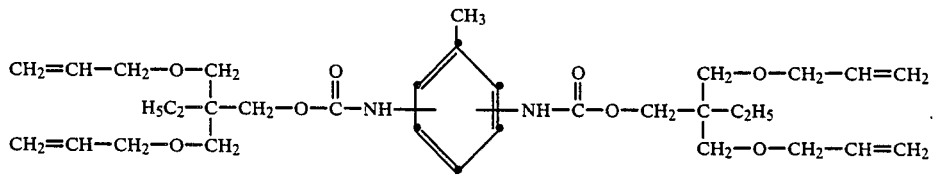

Suitable polymeric binders for the mixtures of type (A) are in particular cellulose acetate butyrate polymers as described in U.S. Pat. No. 4,195,997, polymers having at least 5% of acrylonitrile and at least 5% of aromatically bonded chlorine as described in U.S. Pat. No. 4,278,752, poly-(diallylorthophthalate) as described in U.S. Pat. No. 3,824,104, or polymeric acid binders in combination with an aldehyde condensation resin prepolymer as described in EP-A-No. 115,354.

The polymeric binder can itself carry ethylenically unsaturated groups in the terminal, medial or lateral position.

The photoinitiators which are used in the mixtures of type (A) as forming free radicals on irradiation are compounds known per se. Examples of suitable photoinitiators are substances from the following classes of compound:

(i) polynuclear quinones, for example 2-tert.butylanthraquinone,
(ii) benzoin ethers, for example $C_6H_5-CO-C(CH_3)(OCH_3)-C_6H_5$.

(iii) hetarylimidazole dimers, for example 2-o-chlorophenyl-4,5-diphenylimidazole dimer, in particular in combination with photoreducible dyes,
(iv) aromatic ketones, for example Michler's ketone, in particular in combination with aromatic amines,
(v) thioxanthones, for example 2-chlorothioxanthone, in particular in combination with aromatic amines,
(vi) acylphosphine oxide or acylphosphine sulfide compounds, for example

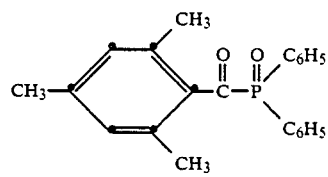

or (vii) titanocenes, for example $(C_5H_5)_2Ti(C_6F_5)_2$; compounds of this type are described in EP-A-No. 119,162.

Further suitable photoinitiators for free radical polymerization are described in U.S. Pat. No. 3,469,982.

Suitable adhesives (b6) are in general known mixtures of type (A) which are generally used as soldering masks for temperatures up to 270° C.

These mixtures contain in particular
(i) polyurethanes having terminal ethylenically unsaturated radicals and having terminal carboxyl groups; or
(ii) mixtures of solid polymers having at least 2 reactive C—C double bonds per molecule and liquid polythiols having at least 2 thiol groups per molecule, the solid polyenes being obtained by reacting a copolymer on a styrene/allyl alcohol base with an unsaturated monocarboxylic acid; or
(iii) mixtures of solid polyenes having at least 2 reactive C—C-double bonds per molecule and liquid polythiols having at least 2 thol groups per molecule, the solid polyenes being obtained by reacting a copolymer on a styrene/allyl alcohol base and at least one reactive unsaturated monoisocyanate; or
(iv) mixtures of a polythiol having at least 2 thiol groups per molecule, a poly-(diallyl orthophthalate) and a liquid polyene which is derived from reacting toluene diisocyanate with the diallyl ether of trimethylolpropane; or
(v) mixtures of liquid polyenes based on trimethylolpropane diallyl ether and toluene diisocyanates, polythiols and silicone oil.

Said mixtures (i) to (v) are described in U.S. Pat. Nos. 4,442,198, 4,045,516, 3,925,320, 3,824,104 and 3,752,720.

If the adhesive (b6) is a mixture (B) of compounds having at least one epoxy group and an ethylenically unsaturated double bond in a molecule and of a photoinitiator which forms free radicals, as defined above, the photopolymerizable components used are for example the compounds which are described in U.S. Pat. Nos. 3,450,613 and 4,220,513 or in EP-A-No. 119,959.

Preferred examples of photopolymerizable compounds of this type which find utility in the mixtures (B) are

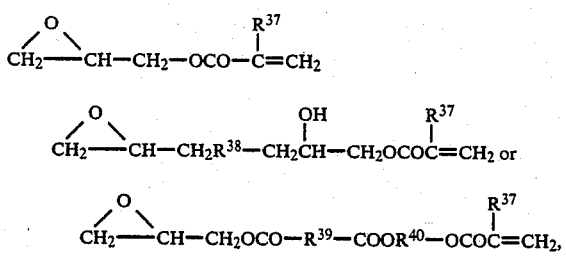

in which $R^{37}$ is hydrogen, chlorine, bromine or $C_1$–$C_4$-alkyl, in particular hydrogen or methyl, $R^{38}$ is the radical of a diglycidyl or polyglycidyl compound after removal of two glycidyl radicals, —OOCR$^{39}$COO— is the radical of a dicarboxylic or polycarboxylic acid and $R^{40}$ is a $C_1$–$C_6$-alkylene group; $R^{38}$ is preferably the radical of a dihydric phenol, in particular of a bisphenol, after removal of the two phenolic H atoms, or of a hydantoin after removal of the two amidic H atoms; —OOCR$^{39}$COO— is preferably the radical of an aromatic, cycloaliphatic or araliphatic dicarboxylic acid, or of an aromatic tricarboxylic or tetracarboxylic acid, for example of phthalic, trimellitic or pyromellitic acid.

$R^{40}$ is preferably an ethylene, propylene or butylene radical.

Specific examples of compounds of this type are: 2-(4-glycidyloxyphenyl)-2-(4-(3-acryloyloxy-2-hydroxypropoxy)-phenyl)-propane, 2-(4-(glycidyloxyphenyl)-2-(4-(2-hydroxy-3-methacryloyloxy)-propoxy)-phenyl)-propane, 1-(2-methacryloyloxyethoxycarbonyl)-2,4- and -2,5-bis-(glycidyloxycarbonyl)-benzene, 1-(2-acryloyloxyethoxycarbonyl)-2,4-and -2,5-bis-(-glycidyloxycarbonyl)-benzene, 1-glycidyl-3-(3-acryloyloxy-2-hydroxypropyl)-5,5-dimethylhydantoin, 1-glycidyl-3-(2-hydroxy-3-methacryloyl-oxypropyl)-5,5-dimethylhydantoin and the reaction product of 3,4-epoxycyclohexylmethyl-3',4'-epoxycyclohexanecarboxylate with 1 equivalent of acrylic or methacrylic acid.

Mixtures of type (C) which can likewise be used as adhesive (b6) in the coatings according to the invention and in which the epoxy function and the ethylenically unsaturated C—C double bond are present in different molecules are described for example in German Offenlegungsschrift No. 2,803,881 or in U.S. Pat. No. 4,090,936.

If adhesive formulations (b5) contain epoxy compounds, preference is given here to those compounds which are essentially derived from aromatic, cycloaliphatic or araliphatic compounds. However, minor amounts of aliphatic compounds can also be added.

The radicals Z', X and X' of the formulae Ia and Ib are as defined in EP-A-No. 132,221. The radical $Z_1$ in the formula III is defined in the same way as the radical Z'.

The radicals $X_1$ and $X_1$ in formulae II and III are defined in the same way as the radical R in EP-A-No. 134,752.

The radicals $Z_1$ and $X_1$ in the formulae II and III are preferably aromatic radicals.

$X_1$ in the formula II is preferably an aromatic radical, a cycloaliphatic radical or a siloxane radical.

The radicals $X_1$ in the formula II and $R^2$ in the formula IX preferably have the structures of the formulae Ic, Id or Ie, as already defined above as preferred for the radical X in the formula Ia.

Particularly preferably, these radicals $X_1$ and $R^2$ are of the formulae

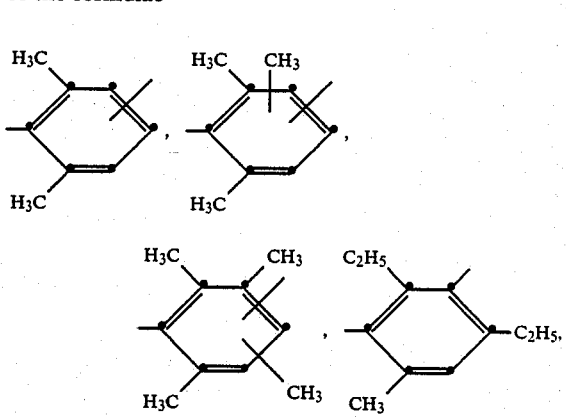

in which the free bonds are in the meta or para-position relative to each other, or of the formula

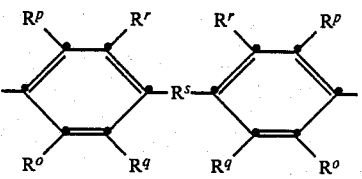

and in which the radicals $R^o$, $R^p$, $R^q$, $R^r$ and $R^s$ are as defined above.

Of the dinuclear radicals, preference is given in particular to those in which $R^o$, $R^p$, $R^q$ and $R^r$ are methyl.

Copolyimides which contain at least 2 different radicals of these formulae are preferably used for the purposes of this invention.

Diamines having these groups 1 are described in U.S. Pat. No. 4,030,948.

A siloxane radical X, $X_1$ or $R^2$ is preferably a radical of the formula —(CH$_2$)$_3$—Si(CH$_3$)$_2$—O—Si(CH$_3$)$_2$—(CH$_2$)$_3$—.

Further suitable diamines having a group X, $X_1$ or $R^2$ which contains siloxane groups are described in U.S. Pat. No. 3,435,002 and in EP-A-No. 54,426.

Examples of preferred diamine radicals $X_1$ in the formula III, $R^2$ in the formula IX or $Z_2$ in the formula XVIII are the groups

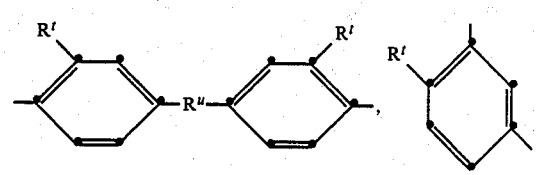

and

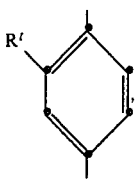

as already defined above as preferred for $X'$ in the formula Ib.

The radicals $Z'$ in formula Ib and $Z_1$ in formula III are preferaly aromatic.

The preferred radicals $Z'$ in the formula Ib, $Z_1$ in the formula III or $Z_2$ in the formulae XVII, XVIII and XIX are

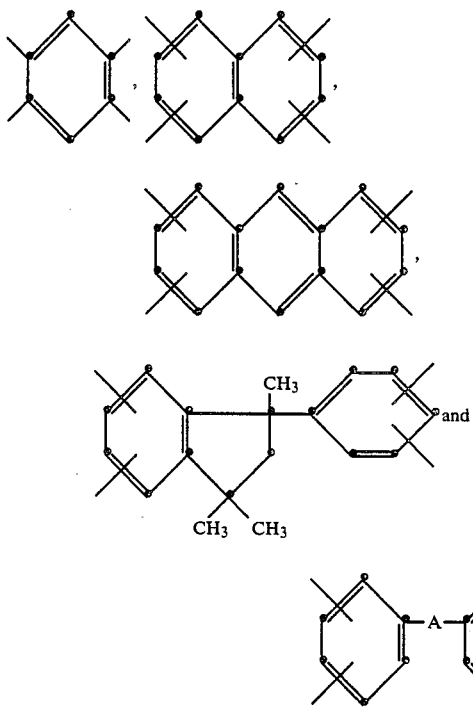

in which A is a direct bond or a bridge group of the formula —O—, —SO$_2$—, —CH$_2$—, —C(CF$_3$)$_2$—, —Si(CH$_3$)$_2$— and in particular —CO—. If the polyimide in question is to be used as an adhesive, the bridge group A is preferably also —CH(OH)—.

The polyimides which are used as film or adhesive materials within the context of this invention can be obtained from carboxylic anhydrides and diamines by condensation methods known per se; these methods of preparation are described in the abovementioned patent applications. Suitable for use in the coating of this invention are in particular homopolyimides as defined above or copolyimides which are obtainable by copolycondensing the abovementioned homopolyimide units with the following carboxylic dianhydrides or diamines or mixtures thereof:

(a) tetracarboxylic dianhydrides: pyromellitic dianhydride,
3,3',4,4'-benzophenonetetracarboxylic dianhydride,
2,2',3,3'-benzophenonetetracarboxylic dianhydride,
3,3',4,4'-biphenyltetracarboxylic dianhydride,
2,2',3,3'-biphenyltetracarboxylic dianhydride,
3,3'-isopropylidenediphthalic anhydride,
(hexafluoro-2,2-bis-(3,4-dicarboanhydridophenyl)-propane, and if the polyimide is to be used as an adhesive also
4,4'-hydroxymethylenediphthalic anhydride and
(b) diamines:
3,3'- and 4,4'-diaminodiphenyl sulfone,
bis-(4-aminophenyl)-bis-(trifluoromethyl)-methane,
bis-(3-aminophenyl)-bis-(trifluoromethyl)-methane,
bis-(3-amino-4-methylphenyl)-bis-(trifluoromethyl)-methane,
4,4'-diaminobenzophenone,
bis-(4-aminophenyl)-dimethylsilane,
4,4'-methylene-bis-(3-methylaniline),
4,4'-methylene-bis-(2-ethylaniline),
4,4'-methylene-bis-(2-methoxyaniline),
4,4'-methylene-bis-(2-methylaniline),
4,4'-sulfonyl-bis-(2-methylaniline),
3,3'-dimethyl-4,4'-diaminobenzophenone,
4,4'-oxydianiline,
4,4'-isopropylidene aniline,
diaminotoluene,
4,4'-methylene-bis-(3-carboxyaniline) and its esters, and also
5-amino-(4-aminophenyl)-1,3,3-trimethylindan.

An alkyl or alkoxy $R^x$ in the formula V can be linear or branched and preferably contains 1 to 4 C atoms. The examples are methyl, methoxy, ethyl, ethoxy, n-propyl, n-propoxy, isopropyl, isopropoxy, butyl and butoxy. A halogen $R^x$ is preferably chlorine, and in the —$C_eH_{2e}$— group, e is preferably 1 or 2. In the formula V, n' is preferably 0.

An alkyl $R^v$ or $R^w$ preferably contains 1 to 4 C atoms. The alkyl can be linear or branched. Examples are methyl, ethyl, n-propyl, isopropyl and butyl. In the —($C_eH_{2e}$)— group, e is preferably 1 or 2.

$Y'$ in the formula V is preferably a direct bond, —O—, —S—, —CH$_2$— or —CO—.

$Q_1$ in the formula IV is the trivalent aromatic radical of an aminodicarboxylic acid. The aromatic radicals are preferably mononuclear or dinuclear phenyl radicals, for example phenyl, naphthyl or bisphenylenes. The radicals can be substituted by halogen, for example chlorine, or cyano or nitro.

If the polyimides contain a radical of the formula IV, $Z_1$ in the formula II can only be the tetravalent radical of a benzophenonetetracarboxylic acid, for example those of the formulae

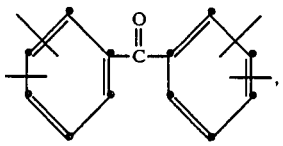

in which the free bonds are bonded in the ortho-position.

The structural elements of the formula II are preferably present in an amount of 5–100 mol %, move preferably 30–100 mol %, especially 60–100 mol % and in particular 80–100 mol %, and the structural elements of the formula III preferably in an amount of 95–0 mol %, more preferably 70 to 0 mol %, especially 60 to 0 mol % and in particular 20 to 0 mol %.

The free bonds in the radicals of the formulae V to VII are preferably bonded in the meta and para-position relative to the CO group.

The radicals $R^{2'}$, $R^2$, $R^3$, $R^4$ and $R^5$ of the structural elements of the formulae IX and X are for example designed as follows:

A halogen $R^3$ is preferably F or Cl. Examples of alkyl, alkoxy and alkylthio $R^3$ are methyl, ethyl, propyl, i-propyl, butyl, pentyl, hexyl, methoxy, ethoxy, propoxy, methylthio, ethylthio and benzylthio.

The bridge group $R^4$ can be for example radicals such as —O—, —S—, —SO—, —SO$_2$—, —CO—, ethylidene, 2,2-propylidene, —CH$_2$— or —C(CF$_3$)$_2$.

An aroyl $R^5$ is in particular benzoyl. Preferably $R^5$ is a hydrogen atom.

Examples of cycloaliphatic, araliphatic or aromatic radicals $R^2$ and $R^{2'}$ are those groups which have already been mentioned for the diamine radicals R and R' in EP-A-No. 134,752.

The polyimides used for the purposes of this invention have (number) average molecular weights of preferably at least 5,000. The upper limit depends essentially on the properties which determine processability, for example their solubility. The upper limit can be up to 500,000, preferably up to 100,000 and in particular up to 60,000. They can further be random polymers or block polymers.

The amount of structural elements of the formulae Ia, IX, X, XI and XII depends essentially on the desired light sensitivity of the homopolymers or copolymers and on their structure. The amount can be 5 to 100 mol %, preferably 20 to 100 mol %, especially 40 to 100 mol %, in particular 50 to 100 mol %, based on the polymer.

The radicals $R^6$, $R^7$ and $R^8$ of the structural element of the formula XI are for example defined as follows:

$R^7$ and $R^8$ are as halogen for example fluorine or chlorine, as aryl they are phenyl, as aryloxy they are phenoxy and as alkyl and alkoxy they preferably contain 1–12, in particular 1–4, C atoms. Examples are methyl, ethyl, n-propyl, i-propyl, butyl, methoxy and ethoxy.

The aromatic radical $R^6$ is preferably substituted by alkyl or aralkyl in at least one, in particular in both, ortho-positions relative to the N atom. An aralkyl substituent is in particular benzyl. An alkyl substituent preferably contains 1–12, in particular 1–4, C atoms. The alkyl can be linear or branched. Particular preference is given to methyl, ethyl and isopropyl. Further examples are n-propyl, n-butyl, isobutyl, pentyl, hexyl, octyl, decyl and dodecyl.

The radicals $R^9$, $R^{10}$, $R^{11}$, $R^{12}$, $R^{13}$, $R^{14}$, $R^{15}$, $X_2$ and $Y_1$ of the homopolyimid and copolyimide elements of the structures XII, XIII and XIV are preferably as defined in EP-A-No. 138,768.

The radicals $Z_2$, $Z_2$, to $R^{27}$ in the structural elements XVII, XVIII and XIX, and also the organic chromophoric polyazides, are defined as mentioned by way of example in EP-A-No. 141,781.

The radicals $R^{41}$ and $R^{42}$ of the halonium salts XXXIII can be substituted by one or more monovalent radicals, for example alkyl or alkoxy having 1 to 8 C atoms, halogen such as F, Cl or Br, nitro or cyano. Examples of radicals $R^{41}$ and $R^{42}$ are phenyl, toluyl, xylyl, chlorophenyl, nitrophenyl, methoxyphenyl and pyridyl. $R^{41}$ and $R^{42}$ together can be for example 2,2'-biphenylene or 2,2'-bipyridyl. $X^a$ is in particular iodine and $q_4$ is in particular 1. $Q^a$ is preferably Cl and in particular F. $L_2$ is preferably boron, phosphorus or antimone.

The radicals $R^{43}$ and $R^{44}$ of the iodosyl salts XXXIV are preferably phenyl or naphthyl which each can be substituted one or more times, for example by $C_1$–$C_4$-alkyl or -alkoxy, phenyl, nitro or halogen. $Q^b$ is preferably Cl and in particular F and $q_5$ is preferably 1. $L_3$ is preferably boron, phosphorus or antimone. An example of these salts is diphenyliodosyl hexafluorophosphate or hexafluoroantimonate.

The radicals $R^{45}$, $R^{46}$ and $R^{47}$ of the sulfonium salts XXXV are preferably carbocyclic aromatic radicals such as phenyl or naphthyl. These can be substituted one or more times, for example by $C_1$–$C_4$-alkyl, $C_1$–$C_4$-alkoxy, phenyl, nitro or halogen. $Q^c$ is preferably Cl and in particular F, and $q_6$ is preferably 1. $L_4$ is preferably boron, phosphorus or antimone. An example is triphenylsulfonium hexafluorophosphate or -hexafluoroantimonate.

The groups $Y_3$, Q, M and $X_4$ in the metal carbonyl complexes of the formula XXVIII are defined as illustrated and preferred in EP-A-No. 94,914. The radicals $R^{48}$, $R^{49}$, Me, Q' and L of the complex salts of the formula XXIX are defined as illustrated and preferred in EP-A-No. 94,915.

Very particularly preferred examples of suitable groups $R^{48}$ are benzene, toluene, xylenes, ethylbenzenes, isopropylbenzene, methoxybenzene, ethoxybenzene, dimethoxybenzene, trimethylbenzene, naphthaline, 1,2-dihydronaphthaline, 1,2,3,4-tetrahydronaphthaline, methylnaphthalines, methoxynaphthalines, ethoxynaphthalines, biphenyl, terphenyl, stilbene, indene, indan, hydroxyindans, methoxyindans, biphenylene, fluorene, phenanthrene, anthracene, 9,10-dihydroanthracene, triphenylene, thiophene, furan, benzothiophene, benzofuran, chromene, xanthene, thioxanthene, naphthothiophene, thianthrene, diphenylene oxide and diphenylene sulfide.

Very particularly preferred examples of suitable groups $R^{49}$ are the cyclopentadienyl anion or the indenyl anion, which can each be substituted by identical or different radicals such as $C_1$–$C_8$alkyl or $C_1$–$C_8$alkoxy.

Examples of substituents on the cyclopentadienyl or idenyl anion are methyl, ethyl, n-propyl, isopropyl, n-butyl, sec.-butyl, tert.-butyl, n-pentyl, n-hexyl and n-octyl, methoxy, ethoxy, n-propoxy, isopropoxy, n-butoxy, n-hexyloxy and n-octyloxy.

The groups $R^{32}$, $R^{33}$, Q'' and $L_1$ are defined as illustrated and preferred in EP-A-Nos. 126,712 and -152,377.

The material coated according to the invention can be effected by applying an adhesive layer to the substrate and subsequently contacting with a polyimide film (process I). However, it is also possible for a polyimide film which has been coated with adhesive on one side to be adhesively embonded onto the substrate (process II). This film of process II thus is a self-adhesive, self-supporting and photostructurable polyimide film.

Applying the adhesive in process I is expediently effected by coating the substrate with an adhesive solution or with a liquid adhesive (mixture).

The adhesive-coated polyimide film of process II has preferably been provided on the adhesive side with an additional cover film, so that the result is a completely dry film which can be wound onto a roll.

By peeling off this protective layer, the adhesive-coated polyimide film can then be laminated directly onto the substrate. If desired, this laminating step takes place by heating to a temperature range of 30°–230° C., thereby correspondingly softening the adhesive layer and bonding it to the substrate.

If desired, the polyimide film can also be mechanically reinforced or protected from the diffusion of chemical substances such as atmospheric oxygen or solvents by applying to the side facing away from the adhesive a further, only temporary plastic film; this additional plastic film should be easily removable; for example by peeling off or, if possible, also by washing off. Plastic-reinforced polyimide films can also be used in process I.

The thickness of the adhesive layer is in general low in comparison with the polyimide film to be subsequently applied. Where appropriate, the solvent is allowed to evaporate after the coating process. This can be effected at elevated temperature.

In general, the adhesive composition is chosen to be such that the polyimide film which is subsequently applied on top and which itself is soluble in organic solvents is at most incipiently but not completely dissolved by any solvent used.

If, to prepare the adhesive, a solvent and, if desired, further additives are used, suitable solvents for this purpose are for example the following, which can be used alone or in mixtures of at least two components: Aliphatic ketones, such as cyclopentanone, cyclohexanone, cycloheptanone, cyclooctanone, 4-methylcyclohexanone, 3-methylcyclohexanone or 2-methylcyclohexanone; aromaticaliphatic ketones, such as acetophenone, propiophenone or butyrophenone; chlorinated hydrocarbons, such as methylene chloride, chloroform, tetrachloroethylene, chlorobenzene or o-dichlorobenzene; ethers, such as ethylene glycol dimethyl ether, diethylene glycol dimethyl ether, tetrahydrofuran or dioxane; ether acetals, such as methylglycol acetate or ethylglycol acetate; and also other polar aprotic solvents, such as propylene carbonate or isophorone, which are somewhat weaker solvents than the powerful polar aprotic solvents, such as N-methylpyrrolidone, $\gamma$-butyrolactone, or N,N-dimethylacetamide.

It is also possible to use thermostable photostructurable adhesives which are free from solvents, or the adhesives can be used in combination with reactive diluents which are converted photochemically or thermally into nonvolatile substances. Such reactive diluents which at the same time can incipiently dissolve the superposed polyimide film are for example 1-vinylpyrrolidone for ethylenically unsaturated crosslinking systems or o-cresyl glycidyl ether for epoxidically crosslinking systems.

Preferably the composition of the thermostable photocrosslinkable adhesive is chosen to be different from the composition of the self-supporting photocrosslinkable polyimide film.

In preparing the photostructurable adhesive, it is possible to incorporate further customary additives which have no adverse effect on the light sensitivity. Examples thereof are matting agents, flow control agents, finely divided fillers, flame retardants, antioxidants, stabilizers, dyes, pigments, adhesion promoters and antihalo dyes as described for example in U.S. Pat. No. 4,349,619.

In the first-mentioned process I, the photostructurable thermostable adhesive can be applied by means of customary methods such as dip, brush or spray processes, whirler, cascade and curtain coating, to suitable substrates or base materials.

Suitable substrates are for example plastics, for example flexible plastic films, metals, for example Al, Cu, Sn, Ag and Au, metal alloys, semimetals, semiconductors, for example Si, Ge or III-V semiconductors, for example gallium arsenide, or materials such as glass, ceramics or other inorganic materials, for example $SiO_2$ or $Si_3N_4$.

The adhesive surface then has applied to it the polyimide film. This can be effected for example by cutting out an appropriately sized piece of film and applying it to the surface, if desired by contact pressure. However, the coating can also be effected automatically, for example by any one of the film application processes customary in laminating technology.

Process II likewise leads to coatings according to the invention. The adhesive-coated polyimide film of this process is obtained by any method customary in the industry for preparing such arrangements. This film can additionally have on the adhesive side a protective film which must be peeled off before use. The adhesive film is applied manually or automatically to a substrate in the manner described above.

The substrate can, as in process I, be additionally surface-treated before the coating step. For example, it can be pretreated with an adhesion promoter.

The substrate coated according to the invention is subsequently image-wise exposed by radiation and the uncrosslinked portions of the two parts of the double coating are then dissolved out by means of a suitable developer.

The photostructuring or photocrosslinking can be caused by high-energy radiation of various kinds, for example by light, in particular in the UV region, by x-rays, synchrotron radiation, laser light or electron beams.

The image-wise exposure is effected in a manner known per se, for example through a photomask. Exposure is preferably effected from the side of the polyimide film; however it can also be effected, in the case of transparent substrates, from the substrate side.

Suitable developers are organic solvents or solvent mixtures which can dissolve only the non-photocrosslinked portions.

After development, the image can be stabilized by means of a thermal or photochemical aftertreatment.

The developer is chosen in such a way that both the applied polyimide film and the underlying thermostable photostructurable adhesive are satisfactorily developed to the same extent.

A particular embodiment of the invention relates to a coated material containing in successive order:
 (a) a substrate having a scattering surface which can be perforated,
 (b) a layer of a photostructurable negative-working thermostable adhesive and
 (c) a self-supporting photocrosslinkable polyimide film, the adhesive layer (b) containing radiation-absorbing additives in such an amount that light which has been laterally scattered at the substrate surface cannot penetrate into the adhesive layer (b) and into the polyimide layer (c).

A scattering surface is to be understood as meaning a surface by which at least 5% of the light incident thereon is scattered laterally. The radiation-absorbing additives added to adhesive layer (b) are in general those dyes or combinations of dyes which are capable of absorbing that radiation which on the one hand penetrates through the polyimide film and on the other hand can initiate the photocrosslinking of the polyimide and of the adhesive. The absorbing dyes can in addition act as sensitizers or as photoinitiators of the curing of adhesive (b).

The material according to the invention is highly suitable for preparing protective films and passivating coats and as a photographic recording material for thermostable relief images.

The protective layers and images are distinguished by their high thermostability and by the small or complete absence of shrinkage under thermal stress, which has considerable advantages in use, since practically no distortion of the imaged structures is observed.

The protective films and relief images are further distinguished by high adhesive strength and thermal, mechanical and chemical resistance. The material coated according to the invention has a long shelf life, but has to be protected from the action of light.

The invention therefore also provides a process for preparing relief images by means of a photolithographic process comprising the following steps:

(i) coating a substrate surface with a photostructurable negative-working thermostable adhesive and, where appropriate, evaporating the solvent, (ii) applying a self-supporting photostructurable polyimide film to the adhesive-coated surface, if necessary by employing pressure and/or heat, (iii) image-wise exposure of the arrangement with actinic radiation from the side of the polyimide film or the substrate, and (iv) developing the system with a suitable developer which, in the unexposed areas, removes both the polyimide film and the adhesive film.

The invention further relates to a process for preparing relief images by means of a photolithographic process comprising the following steps:

(i) coating a substrate surface with the adhesive side of a two-layer system comprising a photostructurable negative-working thermostable adhesive and a self-supporting photostructurable polyimide film, if desired by employing pressure and/or heat, (ii) image-wise exposure of the arrangement with actinic radiation from the side of the polyimide film or the substrate and (iii) developing the system with a suitable developer to remove, in the unexposed areas, both the polyimide film and the adhesive film.

The invention also relates to the relief images obtained by one of the above-described processes.

These images can be used as protective, insulating or passivating layers, as dielectrics, as soldering masks or as interlayers in discrete or integrated semiconductor components, hybrid circuits, circuit boards or multilayers. Another possibility is the use on ceramic substrates (as protection of storage modules from o-radiation) or the use in the tape automated bonding process.

Further fields of use are photomasks for textile printing and the graphic arts, etchresist or galvanoresist for preparing printed circuits, printing plates or integrated circuits, relay for preparing x-ray masks or structural element for liquid crystal indicators.

The invention therefore also relates to the use of the relief images for one of the abovementioned purposes.

The examples below serve to illustrate the invention:

I. GENERAL EXPERIMENTAL CONDITIONS

The substrates used are sheets of $63 \times 63$ mm in size, which comprise copper, copper-epoxy laminate or ceramic. Also used are 3-inch silicon wafers having a superficial 0.1 $\mu$m thick $SiO_2$ layer.

Both the preparation of the photostructurable self-supporting polyimide film before the adhesive bonding and the application of the thermostable photostructurable adhesive are effected by means of the whirler technique. In this technique, the adhesive is whirled in the desired thickness either directly onto the substrate or onto the polyimide film, and the film is then applied manually. The coated substrates are dried, i.e. heated, by the hot plate technique, i.e. by uniform controlled heating from the underside of the substrate. Exposure is obtained, depending on the substrate and the requisite resolution, with a metal halide copying lamp (5000 W Ultralux model from Staub) at a distance of 25 cm between lamp and substrate or a mask alignment and exposure machine from Carl Süss. The latter produces a light output of 22-≈mW/cm$^2$, based on the Optical Associates Inc. measuring sensor at 400 nm.

Development is effected in a spray developer by spraying on the developer solution or the wash solution by means of spray nozzles at a spray pressure of 1.5 bar.

The test pattern used for the coated copper-laminated substrates is the 1-T resolution guide from Stouffer Graphic Arts Equipment Co. The coated wafers and ceramic substrates are tested using the USAF 1951 pattern from Itek Optical Systems Division, the use of masks of opposite toning making it possible to produce not only free-standing webs but also insulating troughs.

The adhesion is tested by means of a chromium mask which leads to the formation of rows of free-standing fields of $2.9 \times 7.3$ mm in size.

The relief images obtained are inspected under an optical microscope as well as by scanning electron micrographs. The layer thicknesses are determined using an "Alphastep" profilometer from Tencor.

II. PREPARATION EXAMPLES

PREPARATION EXAMPLE 1

A 13% solution in gammabutyrolactone is prepared from a cyclized copolyimide obtained from 75 mol % of 1,4-diaminotetramethylbenzene and 25 mol % of 4,4'-diamino-3,3',5,5'-tetramethyldiphenylmethane polymerized with 3,3',4,4'-benzophenonetetracarboxylic dianhydride, which has an inherent viscosity of 0.93 (0.5% in NMP at 25° C.). This solution is filtered to 0.8 $\mu$m and is whirled at 900 r.p.m. for 12 sec onto silicon wafers which have not been provided with an adhesion promoter. This is followed by drying at a temperature of 40° C. to 80° C. in the course of one hour and subsequent leaving at 80° C. for 25 min. This gives uniform dimensionally stable films A of 26.0 $\mu$m in thickness, which can be transferred by slightly slitting and peeling off to any desired substrate.

PREPARATION EXAMPLE 2

Preparation example 1 is repeated, the polymer having been prepared from 55 mol % of 1,4-diaminotetramethylbenzene and 45 mol % of 4,4'-diamino-3,3'-dimethyl-5,5'-diethyldiphenylmethane polymerized with 3,3',4,4'-benzophenonetetracarboxylic dianhydride and cyclizing and having an inherent viscosity of 1.0.

A 12% solution of this polymer is whirled at 1,050 r.p.m. for 12 sec onto wafers which have not been provided with an adhesion promoter. Drying as in preparation example 1 gives uniform and dimensionally stable polyimide films B of 23 $\mu$m in thickness, which, after slight slitting and peeling off, can be transferred to any desired substrate. Whirling at 2,000 r.p.m. for 12 sec gives at once uniform and dimensionally stable polyimide films B-2 of 10 μm in thickness.

PREPARATION EXAMPLE 3

The method of Preparation example 1 is used to prepare a cyclized soluble polyimide from

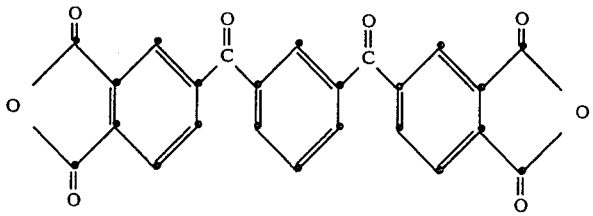

and 4,4′-diamino-3,3′,5,5′-tetramethyldiphenylmethane. The polymer, which has an inherent viscosity of 0.52, is turned into a 15% solution in 4-butyrolactone and filtered to 1.2 μm. Whirling onto wafers which have not been provided with an adhesion promoter (10 sec, 900 r.p.m.) and drying at 80° C. (60 min) gives uniform and dimensionally stable polyimide films C of 10 μm in thickness, which, after slight slitting and peeling off, can be transferred to any desired substrate.

PREPARATION EXAMPLE 4

The polymer of Preparation example 2 is turned into a 4.5% solution in cyclohexanone, which is filtered to 0.65 μm. This solution is used as "adhesive solution 1".

PREPARATION EXAMPLE 5

A 5% solution in cyclohexanone is prepared from a cyclized copolyimide obtained from 55 mol % of 1,4-diaminotetramethylbenzene, 42 mol % of 4,4′-diamino-3,3′-dimethyl-5,5′-diethyldiphenylmethane and 3 mol % of 1,3-bis-(3-aminopropyl)-1,1,3,3-tetramethyldisiloxane by polymerization with 3,3′,4,4′-benzophenonetetracarboxylic dianhydride and filtered to 0.65 μm to give "adhesive solution 2".

PREPARATION EXAMPLE 6

Adhesive solution 2 from Preparation example 5 has added to it, based on the polymer, 6.0% of 2,6-bis-(4-azidobenzylidene)-4-methylcyclohexanone and is filtered once more to give "adhesive solution 3".

PREPARATION EXAMPLE 7

A solution comprising
75% by weight of cyclohexanone
17.5% byweight of semisolid bisphenol-A-epoxy resin having an epoxy content of 4.1 mol/1,000 g
7.5% by weight of liquid bisphenol A epoxy resin having an epoxy content of 5.25 mol/1,000 g and a viscosity of 11,000 mPas at 25° C.
has added to it, based on the total amount of epoxy resin,
6.0% by weight of the complex

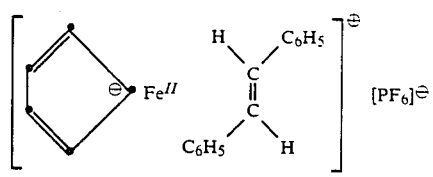

0.2% by weight of Modaflow ® (flow control agent from Monsanto). Filtration to 0.2 μm gives "adhesive solution 4".

PREPARATION EXAMPLE 8

A solution comprising
72% by weight of cyclohexanone
25.5% by weight of semisolid bisphenol-A epoxy resin having an epoxy content of 4.1 mol/1,000 g
2.5% by weight of liquid bisphenol-A epoxy resin having an epoxy content of 5.25 mol/1,000 g and a viscosity of 11,000 mPas at 25° C. has added to it, based on the total amount of epoxy resin,
6.0% by weight of the complex

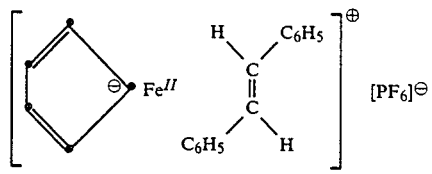

0.2% by weight of Modaflow ® (flow control agent from Monsanto)
2.5% by weight of cumene hydroperoxide
3,5% by weight of 2,6-bis(4-azidobenzylidene)-4-methylcyclohexanone
0.7% by weight of CI Solvent Yellow 145 Filtration to 0.2 μm gives "adhesive solution 5".

PREPARATION EXAMPLE 9

The method of Europ. Pat. Appl. No. 0,076,656, examples 1 and 3, is used to prepare an organopolysilsesquioxane from CH₃SiCl₃ (0.151 mol), C₆H₅SiCl₃ (0.008 mol) and CH₂=CHSiCl₃ (0.041 mol), which is isolated in substance. This is used in the formula
cyclohexanone: 44.78%
cyclopentanone: 30.46%
N-vinylpyrrolidon: 16.40%
2,6-bis(4-azidobenzylidene)-methylcyclohexanone: 0.40%
organopolysilsesquioxane: 7.96%
to obtain, after filtration to 0.8 μm, "adhesive solution 6".

PREPARATION EXAMPLE 10

The photosensitive layer of a commercially available dry film soldering mask (Vacrel ®930, Dupont, 75 μm thick) is mechanically removed from the base layer and formulated as cyclohexanone: 53.28%
cyclopentanone: 36.27%
di-$\pi$-methylcyclopentadienyl-Ti-bis-(2,3,4,5,6-pentafluorophen-1-yl): 0.50%
dry film substance: 9.95%

Filtration through a filter of regenerated cellulose having a pore width of 0.8 μm gives "adhesive solution 7".

PREPARATION EXAMPLE 11
(SELF-ADHESIVE FILMS)

Adhesive solution 4 from Preparation example 7 is whirled at 2,000 r.p.m. for 25 sec onto wafers which, on the surface, carry polyimide films of Preparation example 2. This is followed by drying at 45° to 65° C. for 5 min and then leaving at 65° C. for 5 min. This gives self-adhesive photostructurable polyimide films which can be separated from the preparation substrate by slight slitting and peeling off and which in their self-supporting and self-adhesive form can be applied to any desired substrate.

PREPARATION EXAMPLE 12
(SELF-ADHESIVE FILM)

Adhesive solution 5 from Preparation example 8 is whirled at 1,000 r.p.m. for 25 sec onto a wafer which, on the surface, carries a polyimide film B-1 of Preparation example 2. This is followed by drying at 45° to 65° C. for 5 min and then leaving at 65° C. for 5 min. This gives a self-adhesive photostructurable polyimide film which can be separated from the preparation substrate by slight slitting and peeling off and which in its self-supporting and self-adhesive form can be applied to any desired substrate.

III APPLICATION EXAMPLES

APPLICATION EXAMPLE 1

Adhesive solution 1 from Preparation example 4 is whirled at 3,000 r.p.m. for 15 sec onto a copper-clad epoxy laminate. While the surface, although partially dried, is still moist, polyimide film A from Preparation example 1 is applied by hand and pressed on, and the temperature is then slightly raised to 40° C. for 15 min and then to 60° C. for 15 min. This is followed by covering with a 1-T resolution guide from Stouffer Graphic Arts Equipment Co. and exposure under a 5,000W copying lamp for 2 min. Development then takes place in a spray developer in which a mixture of gammabutyrolactone and toluene (1.00:0.95, by weight) is sprayed on for 300 sec, followed briefly by pure toluene. This gives crisp highly resolved relief images which adhere very well to the substrate.

APPLICATION EXAMPLE 2

The self-adhesive polyimide film from Preparation example 11 is applied by hand to a copper-clad epoxy laminate. The film is pressed on well, is covered with a 1-T resolution guide from Stouffer Graphic Arts Equipment Co. and is then exposed under a 5,000 W copying lamp for 90 sec. The substrate is then placed on a preheated hotplate and the coating is raised to 100° C. in the course of about 1 min, while the polyimide film is pressed lightly against the substrate by a flat cover placed on top. The arrangement is left between 100° and 110° C. for a further 5 min and is allowed to cool down. This is followed by developing in a spray developer for 6.5 min by means of a mixture of cyclopentanone and toluene (1.00 to 0.65, by weight). This gives crisp images having steep edges which adhere very well to the substrate.

APPLICATION EXAMPLE 3

A 3-inch wafer coated with 0.1 μm of $SiO_2$ is whirler-coated at 5,000 r.p.m. for 20 sec with a solution of adhesion promoter $\gamma$-aminopropyltriethoxysilane and then at 3,000 r.p.m. for 12 sec with adhesive solution 2 from Preparation example 5. Polyimide film A from Preparation example 1 is then applied, which is followed by drying first at 40° C. for 5 min and then at 60° C. for 20 min. Covering with the USAF 1951 test mask is followed by exposure for 5 min with a mask alignment and exposure machine in vacuum contact using a light output ratio of 25 mW/cm$^2$.

This is followed by developing for 300 sec by spraying on a mixture of gammabutyrolactone and toluene (1.00:0.95, by weight). This gives highly resolved structures of 26.5 μm in thickness.

The wafer is then placed in a heat treatment furnace and, in air, is gradually heated to 350° C., is left at that temperature for 0.5 h and is then cooled down. No changes to the structures are visible under the microscope, and the layer thickness is now 23.6 μm (89.1% of the original layer thickness). The adhesive layer has a thickness of 0.32 μm.

APPLICATION EXAMPLE 4

The method of Application example 3 is used to coat a 3-inch silicon wafer which is coated with 0.1 μm of $SiO_2$ first with the adhesion promoter $\gamma$-aminopropyltriethoxysilane and then for 12 sec at 300 r.p.m. with adhesive solution 2 from Preparation example 5. Immediately thereafter polyimide film B-2 from Preparation example 2 is applied, and the coating is then heated according to the following schedule:

40° C.: 5 min
60° C.: 5 min
80° C.: 3 min
Heat-up 80–150° C.: 10 min
150° C.: 5 min.

This is followed analagously to Application example 3 by 5 min of exposure through a USAF 1951 test mask. This is followed by developing for 10 min with a mixture of cyclopentanone and toluene (1.00:0.65, by weight), affording highly resolved structures (element 5.6, resolved to 8.8 μm) which even after treatment at 350° C. (15 min, $N_2$) do not change in any way and which adhere very well to the substrate.

APPLICATION EXAMPLE 5

Application example 4 is repeated in all details except that polyimide film C from Preparation example 3 is adhesively embonded. Exposure is for 8 min and development then for 14 min with a mixture of 4-butyrolactone and xylene (1:1, by volume). Although stress cracks can be observed in the layers, extremely highly resolved well-adhering polyimide images are produced, so that the free standing structures of the USAF 1951 test pattern are preserved down to the last detail and even element 6.2 (7.0 μm) is still well resolved. The total layer thickness is 12.4 μm.

APPLICATION EXAMPLE 6

A white ceramic sheet having a porous surface has applied to it, by hand, the self-adhesive polyimide film from Preparation example 12. The film is pressed on well, is covered with USAF 1951 test masks from Itek Optical Systems Division and is exposed for 5 min with a mask alignment and exposure machine from Carl Süss at a light output ratio of 22 mW/cm², based on the measuring sensor at 400 nm from Optical Associates Inc.

The coated ceramic is then heated on preheated hotplates in accordance with the following schedule, the polyimide applied being lightly pressed into the substrate by a flat cover placed on top.
1. 15 min 65° C.
2. 5 min 90° C.
3. 5 min 100° C.

This is followed by cooling down and subsequently developing in a spray developer for 14 min with a mixture of cyclopentanone and toluene (1.00:0.65, by weight) and washing with toluene.

This gives relief images which adhere very well to the substrate and have steep edges, of the free-standing structures element 2.6 with a width of 70 μm and of the insulated troughs element 1.2 with a width of 223 μm still being well resolved. The total layer thickness is 25 μm.

APPLICATION EXAMPLE 7

The method of Application example 3 is used to bond polyimide film B-2 with adhesive solution 6 onto a 3-inch silicon wafer. Exposure for 5 minutes and development for 10 minutes with cyclopentanone/toluene (1.00:0.65, by weight) likewise gives highly resolved structures.

APPLICATION EXAMPLE 8

A 3-inch wafer coated with 0.1 μm of SiO₂ is whirler-coated first at 4,000 r.p.m. for 10 sec with a solution of adhesion promoter γ-aminopropyltriethoxysilane and then at 2,000 r.p.m. for 5 sec with the adhesive solution from Preparation example 9. Polyimide film B-2 from Preparation example 2 is then applied. This is followed by drying at 50° C. for 23 min and then by exposure for 10 min with a light output ratio of 26.0 mW/cm² through a mask which produces free-standing fields of 2.9×7.5 mm in size. After removal of these fields by developing for 7 min with cyclopentanone/toluene (1.00:0.60, by weight), the structures are placed in a furnace and are heated up to 350° C. in nitrogen and are left at that temperature for 15 min. After cooling down, the adhesion of these structures to the substrate is checked by firmly pressing an adhesive tape onto the fields and then pulling off the tape. Except for a few defects caused by enclosed air bubbles, after this treatment no delaminations whatsoever can be observed in the area as a whole.

APPLICATION EXAMPLE 9

A polished, cleaned and degreased sheet of copper is whirler-coated at 1500 r.p.m. for 8 sec with adhesive solution 7 from Preparation example 10. This is followed by drying at 45° C. for 45 sec and at 100° C. for 30 sec, cooling, applying polyimide film B-2 from Preparation example 2 and heating once more at 500° C. for 30 sec. This is followed by exposure for 10 min with 26.0 mW/cm through the mask which produces fields of 2.9×7.3 mm in size. These structures are then developed for 18 min by spraying with a mixture of cyclopentanone and 1,1,1-trichloroethane (1.0:0.80, by weight), and the resulting structures are subjected for 10 min to a whole-area afterexposure by means of a metal halide copying lamp at a distance of 25 cm.

In the subsequent adhesive tape test, no delaminations whatsoever are observed, and even after stepwise, cyclical heating up and cooling down to 200°, 250°, 300°, 350° C. (each under N₂, 15 minute holding at end temperature) no delaminations whatsoever are observed in the adhesion test carried out each time.

APPLICATION EXAMPLE 10 (ADHESION TEST)

The experiment of Application example 4 is repeated with the above-described mask for the adhesion test. After heating the fields to 350° C. (N₂, 15 min) and cooling down, none of the fields can be pulled off by means of adhesive tape. Nor can any delaminations be observed on applying the adhesive tape test to the free-standing fine structures of the USAF 1951 test pattern from Application example 4.

APPLICATION EXAMPLE 11 (ADHESION TEST)

A 10 μm thick self-adhesive polyimide film from Preparation example 11 is adhesively bonded without use of an adhesion promoter to a 3-inch silicon wafer coated with 0.1 μm of SiO₂. This is followed by exposure for 5 min under 26 mW/cm² through the mask used for the adhesion test. The temperature is briefly raised to 115° C., while the film is lightly pressed against the substrate. After 6 minutes of spraying on a mixture of cyclopentanone and toluene (1.00:0.65, by weight) the structures obtained are heated to 350° C., are cooled down and are subjected to the adhesive tape test. No delaminations whatsoever are observed.

What is claimed is:
1. A process for preparing relief images by means of a photolithographic process, comprising the following steps:
   (i) coating a substrate surface with a photostructurable negative-working thermostable adhesive
   (ii) applying a self-supporting photostructurable polyimide film to the adhesive-coated surface,
   (iii) image-wise exposure of the arrangement with actinic radiation from the side of the polyimide film or of the substrate, and
   (iv) developing the system with a suitable developer in order to remove in the unexposed areas both the polyimide film and the adhesive film.
2. A process according to claim 1 where in step (i) the adhesive contains a solvent which is evaporated after the coating step.
3. A process according to claim 1 where in step (ii) the polyimide film is applied to the adhesive coated surface by employing pressure, heat or both pressure and heat.
4. A relief image obtained by the process according to claim 1.
5. A process according to claim 1 wherein the self-supporting photostructurable polyimide film in step (ii) has a thickness of 3–300 μm and comprises a homopolyimide or copolyimide having an average molecular weight of at least 2,000, which contains at least

5 mol %, based on the polymer, of at least one structural element of the formulae IX or X

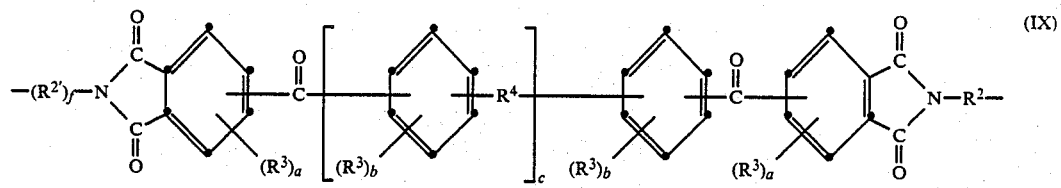

(IX)

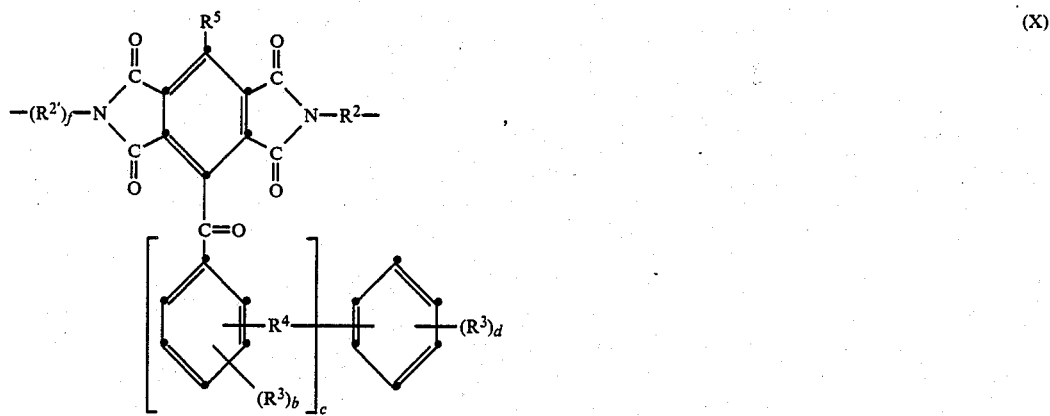

(X)

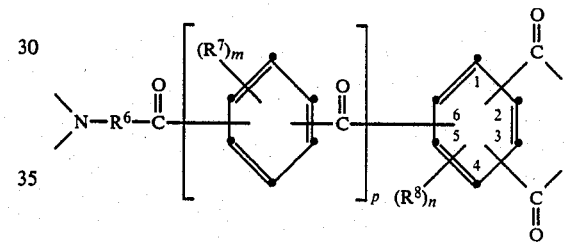

in which
R³ is halogen, nitro, $C_1$–$C_6$-alkyl, $C_1$–$C_6$-alkoxy, $C_1$–$C_6$-alkylthio, which can be substituted by phenyl, or is phenyl, phenoxy or phenylthio,
R⁴ is a direct bond or a bridge group,
R⁵ is a hydrogen atom or aroyl or is defined in the same way as R³,
a is 0, 1, 2 or 3, b is 0, 1, 2, 3 or 4, c and d are 0, 1, 2, 3, 4 or 5, f is 0 or 1, and, when a, b and d are 2, the two R³ together can also be —CH=CH—CH=CH— bonded in the o-position and
R² and R²' are an unsubstituted cycloaliphatic or araliphatic radical, an aromatic radical where two aryl nuclei are linked via an aliphatic group, or an aromatic radical which is substituted by at least one alkyl group, cycloalkyl group, alkoxy group, alkoxylalkyl group, alkylithio group, alkylthioalkyl group, aralkyl group or, on two adjacent C atoms of the aromatic radical, by an alkylene group, R² being an aromatic radical which is substituted in the two ortho-positions relative to at least one N atom, when f is 0.

6. A process according to claim 1 wherein the self-supporting photostructurable polyimide film in step (ii) has a thickness of 3–100 μm and comprises homo-polyimides or copolyimides which contain structural elements of aromatic aminodicarboxylic acids, having an inherent viscosity of at least 0.1 dl/g, measured at 25° C. in a solution of 0.5% by weight of polymimide in N-methylpyrrolidone, which contain recurring sturctural elements of the formula XI in which R⁷ and R⁸ are halogen, nitro, aryl, aryloxy, alkyl or alkoxy, m is 0 or a number from 1-4, n is 0 or a number from 1 to 3 and p is 0, 1 or 2, the free carbonyl groups are bonded in ortho-position relative to each other and R⁶ is a divalent aromatic radical which is substituted by at least one alkyl group or aralkyl group.

7. A process according to claim 1 wherein the photostructurable negative-working thermostable adhesive in step (i) is a compound or mixture of compounds selected from the group consisting of
 (b1) photocrosslinkable polyimides which are soluble in organic solvents;
 (b2) photocrosslinkable polyamidic acids or their esters;
 (b3) photocrosslinkable organopolysilsesquioxanes;
 (b4) photocrosslinkable polyamide-imides;
 (b5) photocrosslinkable epoxy systems; and
 (b6) photocrosslinkable systems which contain compounds having ethylenically unsaturated groups which can undergo free radical polymerization.

8. A process according to claim 7 where the adhesive is (b1) a solution of polyimide or (b1) a solution of polymide in combination with an organic chromophoric polyazide.

9. A process according to claim 7 wherein the adhesive (b1) comprises a homopolymer or copolymer which is derived from at least one aromatic tetracarboxylic acid and at least one diamine and comprises 0.1 to 100 mol % of at least one structural element of the formula II

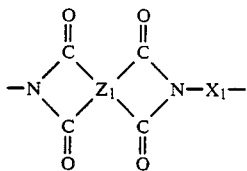

and 99.9 to 0 mol % of at least one structural element of the formulae III and/or IV

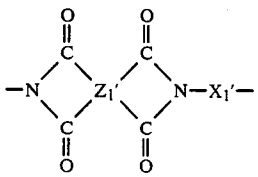

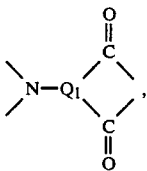

in which $Z^1$ is at least one tetravalent radical of the formulae V, VI, VII or VIII

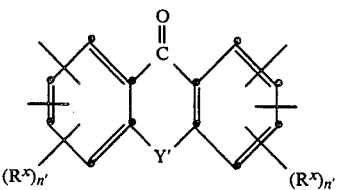

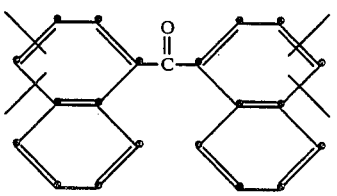

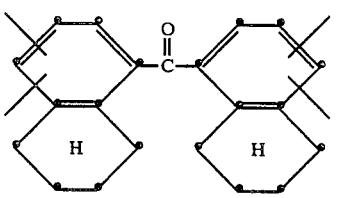

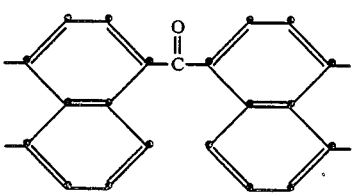

in which the free bonds are bonded in the ortho-position relative to each other and Y' is a direct bond, —CH$_2$—, —(CH$_2$)$_2$—, —O—, —S—, —SO—, —SO$_2$—, —CO—, —NR$^v$— or —CR$^v$R$^w$— where R$^v$ is a hydrogen atom, C$_1$-C$_{10}$-alkyl, phenyl, naphthyl or phenyl(C$_e$H$_{2e}$)— where e is 1 to 4 and R$^w$ is defined in the same way as R$^v$ except that it is not a hydrogen atom, R$^x$ is C$_1$-C$_{10}$-alkyl, halogen, —CN, —NO$_2$, C$_1$-C$_{12}$-alkoxy, phenoxy, naphthoxy or phenyl-(C$_e$H$_{2e}$)— where e is 1–4, n' is 0, 1 or 2, X$_1$ is an unsubstituted or substituted heterocylic, cycloaliphatic or araliphatic radical, an aromatic radical where two aryl nuclei are linked via an aliphatic group, or an aromatic radicl which is substituted by at least one alkyl group, cycloalkyl group, alkoxy group, alkoxyalkyl group, alkylthio group, alkylthioalkyl group, hydroxyakyl group, hydroxyalkoxy group, hydroxylakylthio group, aralkyl group or, on two adjacent C atoms ofthe aromatic radical, by an alkylene group, Q$_1$ is a trivalent aromatic radical, Z$_1$ is defined in the same way as Z$_1$ or is a tetravalenet organic radical different from Z$_1$, and X$_1$' is the divalent radical, diffrnet from X$_1$, of an organic diamine, where Z$_1$ in formulae II can also be tetravalent benzophenone radicals if structural elements of the formula IV are present.

10. A process according to claim 8 wherein the adhesive (b1) comprises
(a) a homopolyimide or copolyimide of aromatic tetracarboxylic acids and aromatic diamines or aromatic and aliphatic diamines which is soluble in organic solvents, at least one aliphatic group being bonded directly or via a bridge group to at least a portion of the tetracarboxylic acid radicals, of the aromatic diamine radials or of the two radicals, and/or at least a portion of these radicals containing, as an aliphatic bridge group, alkylene, alkylidene, cycloalkylidene or Si(alkyl)$_2$, and
(b) at least 0.1% by weight, based on the polyimide component, of at least one organic chromophoric polyazide in which the azide groups are bonded directly or via an SO$_2$ group to aromatic hydrocarbon radicals.

11. A process according to claim 10 wherein the homopolyimide or copolyimide comprises 50 to 100 mol % of recurring structural elements of the formulae XVII and/or XVIII

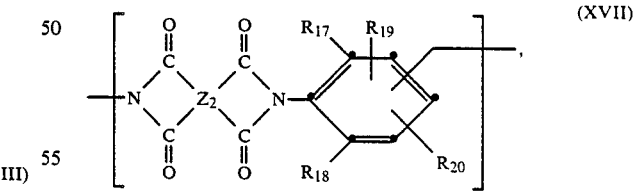

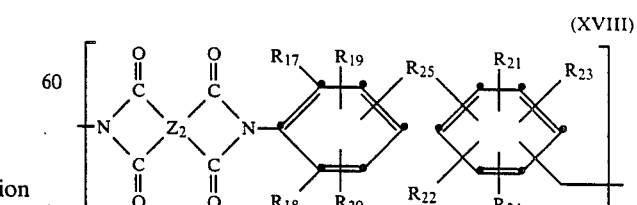

and 50 to 0 mol % of recurring structural elements of the formula XIX

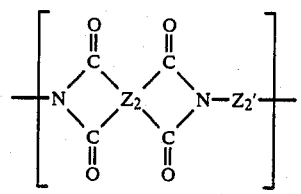
(XIX)

where in the formulae XVII, XVIII and XIX the four carbonyl groups are bonded to different carbon atoms and two carbonyl groups each are in ortho- or peri-position relative to each other, $Z_2$ is a tetravalent radical which contains at least one aromatic ring, $Z_2'$ is a divalent organic radical which differs from the groups

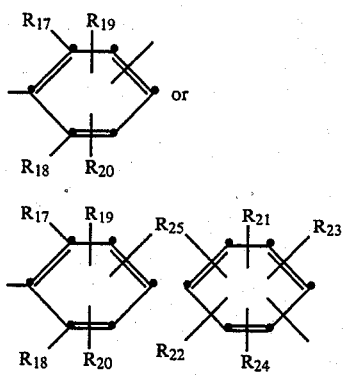

and is selected from the group consisting of aromatic, alkylaromatic, aliphatic, cycloaliphatic and heterocyclic radicals, combinations thereof and radicals with oxygen-, sulfide-, nitrogen-, silicon- or phosphorus-containing bridge groups,

- $R_{17}$ and $R_{18}$ independently of each other are alkyl with 1-4 C atoms,
- $R_{19}$, $R_{20}$, $R_{22}$, $R_{23}$ and $R_{24}$ independently of one another are hydrogen or alkyl having 1-4 C atoms and
- $R_{25}$ is a direct bond, —O—, —S—, —SO$_2$—, —CO—, —CH$_2$—, —C(CF$_3$)$_2$—, cycloalkylidene having 5-6 ring carbon atoms, phenylene,

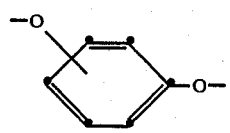

or a group

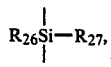

in which $R_{26}$ and $R_{27}$ are alkyl or alkoxy each having 1-6 C atoms, phenyl, benzyl, phenyloxy or benzyloxy.

12. A process according to claim 7 in which the thickness of the adhesive layer in the full curved state is less than 5 μm and the photostructurable negative-working thermostable adhesive used is na organopolysilsesquioxane of the formula XXXI

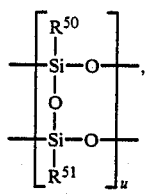
(XXXI)

in which $R^{50}$ and $R^{51}$ are independently of each other monomvalent hydrocarbon radicals and u is a whole number greater than 30.

13. A process according to claim 7 in which the adhesive (b4) comprises linear saturated homopolycondensates or copoly-condensates from the group of the polyamide-imides having bezophenonetricarboxylic acid radicals with at least one recurring structural element of the formula XII

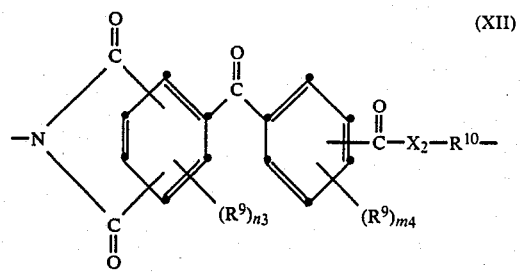
(XII)

and in the case of copolycondensaes additionally recurring structural elements of the formulae XIIII and/or XIV

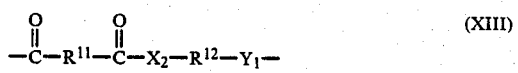
(XIII)

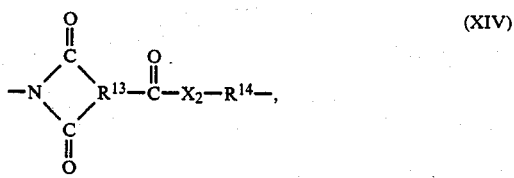
(XIV)

in which the imide group in structural element XII is bonded to two adjacent C atoms, $m_4$ is 0 or a number from 1 to 4 and $n_3$ is 0 or a number from 1 to 3, $X_2$ is —S—, —O— or —NR$^{15}$— and $Y_1$ independently is defined in the same way as $X_2$, $R^9$ is alkyl or alkoxy having fewer than 6 C atoms, aryl having 6 to 10 C atoms, aralkyl having 7 to 10 C atoms or halogen, $R^{12}$ is an unsubstituted or substituted divalent aliphatic, cycloaliphatic, araliphatic or aromatic radical, and if $X_2$ and $Y_1$ are the group —NR$^{15}$—, $R^{12}$ and one of the $R^{15}$ are together alkylene having 5 to 7 C atoms to which the second —NR$^{15}$— group is bonded, or $R^{12}$ is methylene, ethylene or propylene and the two $R^{15}$ of the NR$^{15}$ groups are together ethylene or propylene or $X_2$ or $Y_1$ are —S— or —O— and the other —NR$^{15}$—, $R^{12}$ and $R^{15}$ together are alkylene having 5-7 C atoms to which the group —O— or —S— is bonded, $R^{10}$ is an unsubstituted or subsitituted divalent aliphatic or aromatic hydrocarbon radical, $R^{14}$ is independently defined in the same way as $R^{10}$, $R^{11}$ is a divalent asaturated aliphatic or aromatic radical, $R^{13}$ is a trivalent saturated aliphatic or aromatic radical in which the imide group is bonded to two adjacent C atoms and $R^{15}$ is a hydrogen atom, alkyl, cycloalkyl, aryl, aralkyl or alkaralkyl, the polycondensates containing the structural elements of the formula XII in an amount of at least 10 mol %, based on the copolycondensate.

14. A process according to claim 7 in which the adhesive (b5) comprises a photocrosslinkable epoxy resin or mixture of such resins containing
   (a) an aromatic, cycloaliphatic or araliphatic compound which contains at least one 1,2-epoxy group,
   (b) at least one photoinitiator suitable for the photocrosslinking of epoxy resins alone or in combination with
   (c) a photoacelerant, and, at least one aromatic, cycloaliphatic or araliphatic compound usable as as latent hot-curing agent.

15. A process according to claim 14 in which photoinitiator (b) is a halonium salt of the formula XXXIII

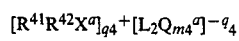  XXXIII in which $R^{41}$ and $R^{42}$ independently of each other are a carbocyclic or heterocyclic aromatic radical having 6 to 20 C atoms or $R^{41}$ and $R^{42}$ together are a divalent carbocylic or heterocyclic aromatic radial, $X^a$ is a halogen atom, $m_4$ is a number which is equal to the total of the valencies of $L_2$ and $q_4$, $L_2$ is a divalent to heptavalent metal or non-metal and $Q^a$ is a halogen atom, and $q_4$ is a number from 1 to 3.

16. A process according to claim 14 in which photoinitiator (b) is an iodosyl salt of the formula XXXIV

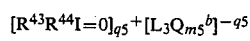  XXXIV, in which $R^{43}$ and $R^{44}$ are a carbocyclic or heterocyclic aromatic radical having 6 to 20 C atoms, $m_5$ is a number which is equal to the total of the valencies of $L_3$ and $q_5$, $L_3$ is a divalent to heptavalent metal or non-metal and $Q^b$ is a halogen atom, and $q_5$ is a number from 1 to 3.

17. A process according to claim 14 in which the photoinitiator used is a sulfonium salt of the formula XXXV

  XXXV in which $R^{45}$, $R^{46}$ and $R^{47}$ independently of one another are a carbocylic or heterocyclic aromatic radical having 6 to 20 C atoms or one of $R_{45}$, $R_{46}$ and $R_{47}$ is this aromatic radical and the other two together are a divalent carbocylic or heterocyclic aromatic radical, $m_6$ is a number which is equal to the sum of the valencies of $L_4$ and $q_6$, $L_4$ is a divalent to heptavalent metal or non-metal and $Q^c$ is a halogen atom, and $q_6$ is a number from 1 to 18. A process according to claim 14 in which photoinitiator (b) is
   (I) an active amount of a salt of the formula XXVIII

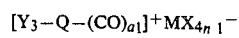  (XXVIII), in which $Y_3$ is an arene group or dienylium group, Q is an atom of a transition metal selected from the group consisting of titanium, vanadium, chromium, manganese, iron, cobalt, nickel, copper, niobium, molybdenum, rutheium, rhodium, palladium, silver, tantalum, tungsten, rhenium, osmium, iridium, platinum and gold, $a_1$ is a positive whole number such that the atom Q has a complete electron shell configuration, M is an atom of a metal or non-metal, $n_1$ 4,5 or 6 and larger by unity than the valency of M and $X_4$ is a fluorine or chlroine atom, with the proviso that, when M is antimony, $n_1$ is 6 and five of the symbols $X_4$ are fluorine, and one can also be a hydroxo group; or (II) an active amount of a salt of the formula XXIX

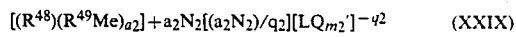  (XXIX)

in which $a_2$ is 1 or 2 and $n_2$ and $q_2$ independently of each other are each a whole number from 1 to 3, Me is the cation of a monovalent to trivalent metal from the group IV to VIIb, VIII or Ib of the Periodic Table of Elements, $m_2$ is a whole number equal to the valency of L and $q_2$ and Q' is a halogen atom, L is a divalent to heptavalent metal or non-metal, $R^{48}$ is a $\pi$-arene and $R^{49}$ is a $\pi$-arene or the anion of a $\pi$-arene.

19. A process according to claim 18 in which photoinitiator (b) is at least one iron compound of the formula XXX

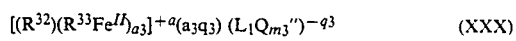  (XXX)

in which
   $a_3$ is 1 or 2 and $q_3$ is 1, 2 or 3,
   $L_1$ is a divalent to heptavalent metal or non-metal,
   Q'' is a halogen atom,
   $m_3$ is a whole number which is equal to the total of the valencies of $L_1$ and $q_3$,
   $R^{32}$ is a $\pi$-arene and $R^{33}$ is the anion of a $\pi$-arene; in which the compound of the formula XXX is used together with at least one electron acceptor as oxidizing agent and/or together with a sensitizer for the compound of the formula XXX.

20. A process according to claim 14 in which adhesive (b5) is a photocrosslinkable and subsequently still heat-curable epoxy resin based on bisphenol diglycidyl ethers, which in addition to free epoxy groups also contains photocrosslinkable radicals

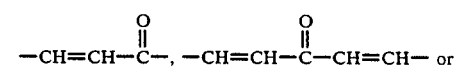

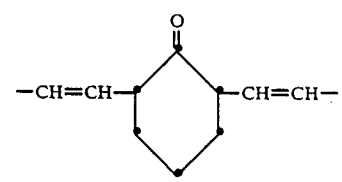

which are present in an amount of at least 10 mol %, based on the bisphenol units, as bridges between the aromatic nuclei of the bisphenol.

21. A process according to claim 14 in which adhesive (b5) comprises a mixture of compounds having ethylenically unsaturated groups which can undergo free radical polymerization, selected from the group consisting of
   (A) mixtures which comprise
      (a) at least one ethylenically unsaturated compound which can undergo free radical polymerization and has a boiling point above 100° C. under atmospheric pressure,
(b) at least one organic, inorganic or organometallic phootoinitiator which, on irradiation, forms free radicals, and
(c) a polymeric binder; or
(B) mixtures which comprise
(a) compounds or mixtures of copounds having not only at least one medial epoxy group and/or at least one structural element of the formula XXXII,

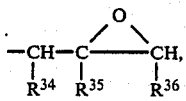
(XXXII)

which is bonded terminally directly to an oxygen atom or nitrogen atom, in which $R^{34}$ and $R^{36}$ are each a hydrogen atom, when $R^{35}$ is then a hydrogen atom or a methyl group, or $R^{34}$ and $R^{36}$ together are —CH$_2$—CH$_2$, when $R^{35}$ is then a hydrogen atom, but also having at least one ethyleically unsaturated double bond in a molecule, and
(b) lest one photoinitiator which, on irradiation, forms free radicals along or in combination with
(c) polymeric binder, a heat-activatable polymerizing agent for 1,2-epoxy resins and/or photosensitizers or photoinitiators for epoxy polymerization; or
(C) mixtures which comprise
(a) an epoxy rsin havign at least one medial epoxy group and/or at least one epoxy group of the formula XXXII, as defined above, and
(b) a compound which can undergo free radical photopolymerization or in combination with
(c) a heat-activatable curing agent for the epoxy resin.

22. A process according to claim 1 in which the substrate has a scattering surface and in which the adhesive contains a radiation-absorbing additive in such amount that light scattered laterally at the substrate surface does not penetrate into the adhesive or into the polyimide film.

23. A process according to claim 1 wherein the self-suppporting photostructurable polyimide film in step (ii) has a thickness of 3–300 um and comprises a homopolyimide or copolyimide which has 5 to 100 mol %, based on the total molecule, of at least one structural element of the formula Ia and 95–0 mol % of at least one structural element of the formula Ib,

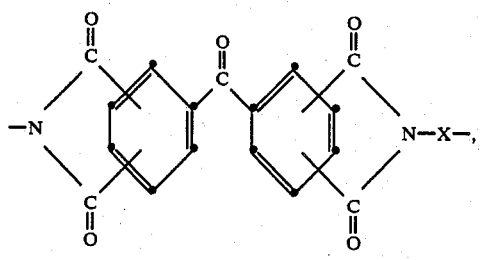
(Ia)

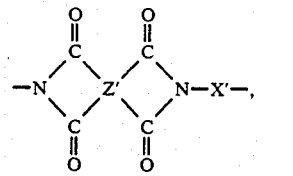
(Ib)

where the carbonyl groups in the formula Ia are in each case pairwise in the ortho-position relative to each other,
Z' is a tetravalent benzophenone radical or another unsubstituted or substituted tetravalent aromatic radical to which in each case two carbonyl groups are bonded in the ortho or peri-position,
X is a divalent radical of an aromatic diamine wherein the aromatic ring is substituted by alkyl, alkoxy, alkoxyalkyl or aralkyl in both ortho-positions relative to at least one N atom or in at least one ortho-position relative to both N atoms, or two adjacent C atoms of the aromatic ring are substituted by alkylene, and
X' is a divalent radical of an aromatic diamine which differs form X or a divalent radical of an aliphatic diamine.

24. A process according to claim 23 where in the polyimide polymer at least 50 mol % of the polymer, based on the total molecule, comprise structural elements of the formula Ia, and wherein the radical Z' of the structural element of the formula Ib is independently selected from the group consisting of

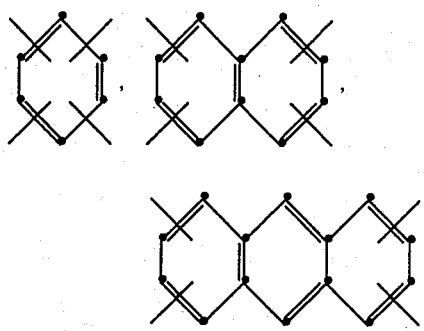

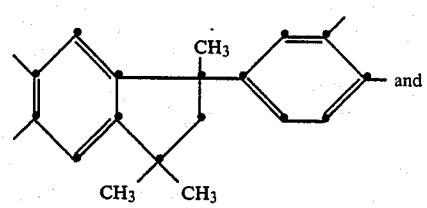
and

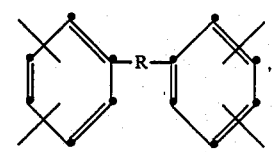

in which R is a direct bond or is

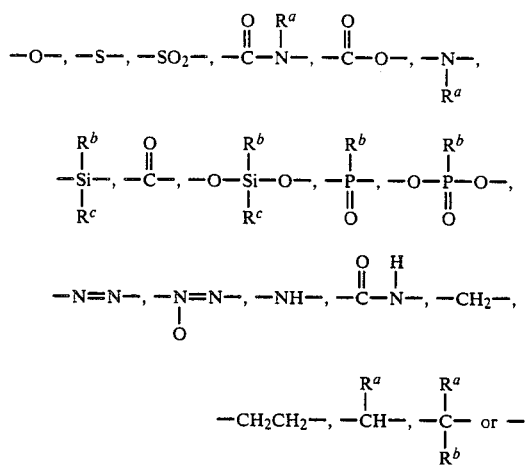

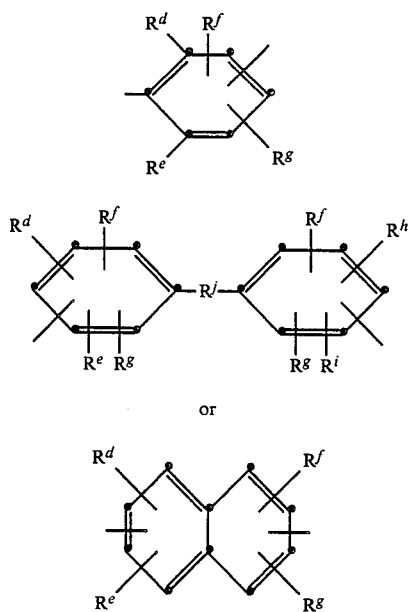

in which $R^a$, $R^b$ and $R^c$ are alkyl having 1 to 6 C atoms, phenyl or benzyl or $R^b$ and $R^c$ are also alkoxy having 1 to 6 C atoms, phenyloxy or benzyloxy, X' of the structural element Ib is $C_2$-$C_{30}$alkylene, $C_5$-$C_8$cycloalkylene, $C_7$-$C_{30}$aralkylene, $C_6$-$C_{22}$arylene or polysiloxane, X of structural element Ia is (Ic)

(Id)

or (Ie)

in which, in the formula Ic, the free bonds are in the meta- or para-position relative to each other, in the formula Id the free bonds are in the meta- or para-position relative to the $R^j$ group and $R^d$ and $R^e$ are bonded in the two ortho-positions relative to the free bond, and in the formula Ie the free bonds are bonded in the 2-, 3-, 6- and 7-position and $R^d$ and $R^e$ are situated in the two ortho-positions relative to the free bonds, $R^j$ is a direct bond, —O—, —S—, —SS—, —SO—, —SO$_2$, —CO—, —COO—, —NH—, —N—alkyl having 1 to 6 C atoms in the alkyl, —N—phenyl,

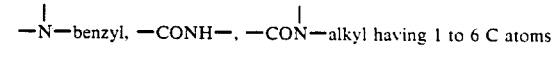

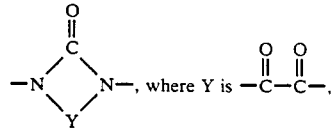, where Y is $-\overset{O}{\overset{\|}{C}}-\overset{O}{\overset{\|}{C}}-$,

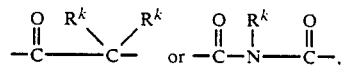

$R^k$ is a hydrogen atom, $C_1$-$C_6$alkyl or phenyl, or the group $R^j$ is a linear or branched alkylene group having 1 to 3 C atoms, alkylidene which has 2 to 12 C atoms and can be substituted by Cl or F, cycloalkylidene having 5 to 6 ring carbon atoms, phenylene, phenylenedioxy, or the group $R^lSiR^m$,

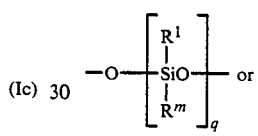

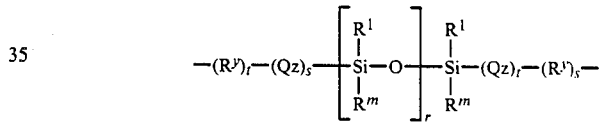

in which $R^l$ and $R^m$ are alkyl or alkoxy having 1 to 6 C atoms, phenyl, benzyl, phenyloxy or benzyloxy, r is a number from 1 to 10, t is 0 or 1 and s is 0 or 1, and RY is —O— or —S— and $Q_2$ is $C_1$-$C_6$ alkylene, and q is a number from 1 to 100, $R^d$ and $R^e$ are alkyl or alkoxy having 1 to 12 C atoms, alkoxyalkyl having 2 to 12 C atoms, cyclopentyl, cyclohexyl or benzyl or in the formulae Ic or Id, $R^d$ and $R^f$ are in adjacent positions and together are trimethylene or tetramethylene, and $R^e$ can also be a hydrogen atom, $R^f$, $R^g$, $R^h$ and $R^i$ are independently a hydrogen atom or alkyl or alkoxy having 1 to 12 C atoms, alkoxyalkyl having 2 to 12 C atoms, cyclopentyl, cyclohexyl or benzyl or $R^f$ and $R^h$ in the formula Id together are trimethylene or tetramethylene.

25. A process according to claim 24 wherein Z' is a radical of the formula

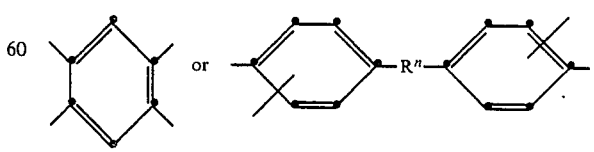

in which $R^n$ is a direct bond, —O—, —SO$_2$—, —CH$_2$—, —C(CF$_3$)$_2$ or —CO—, in which the radical X is selected from the group consisting of

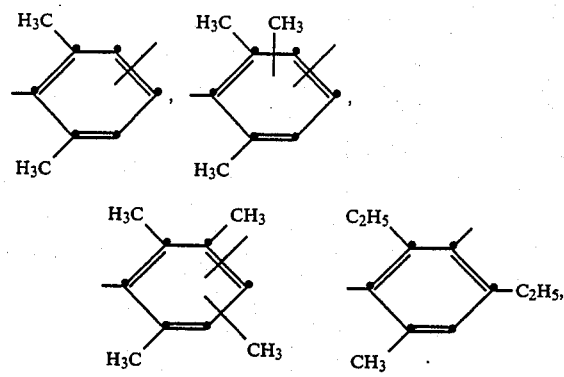

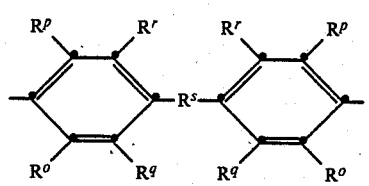

in which the free bonds are in the meta- or para-position relative to each other, and in which $R^o$ and $R^p$ are independently methyl, ethyl, n-propyl or isopropyl and $R^q$ and $R^p$ are independently methyl, ethyl, n-propyl or isopropyl and $R^q$ and $R^r$ are a hydrogen atom or are defined in the same way as $R^o$ or $R^o$ and $R^q$ are together trimethylene and $R^p$ and $R^r$ are a hydrogen atom, and $R^s$ is a direct bond, —CH$_2$—, —C(CH$_3$)$_2$—, 2,2-propylidene or —CO—, and in which the radical $X'$ is selected from the group consisting of

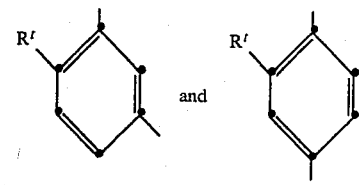

in which $R^u$ is a direct bond, —O—, —CO—, —C(CF$_3$)$_2$— or —CH$_2$—, and $R^t$ is methyl, ethyl, isopropyl, methoxy, ethoxy or a hydrogen atom.

26. A process for preparing relief images by means of photolithographic process, comprising the following steps:
   (i) coating a substrate surface with the adhesive side of a two-layer system comprising photostructurable negative-working thermostable adhesive and self-supporting photostructurable polyimide film,
   (ii) image-wise exposure of the arrangement with actinic radiation from the side of the polyimide film or of the substrate and
   (iii) developing the system with a suitable developer in order to remove in the unexposed areas the polyimide film and the adhesive film.

27. A process according to claim 26 where in step (i) the substrate surface is coated with the adhesive side of the two-layer system by employing pressure, heat or both pressure and heat.

28. A relief image obtained by the process according to claim 26.

29. A process according to claim 26 wherein the self-supporting photostructurable polyimide film in step (i) has a thickness of 3–300 μm and comprises a homopolyimide or copolyimide having an average molecular weight of at least 2,000, which contains at least 5 mol %, based on the polymer, of at least one structural element of the formulae IX or X

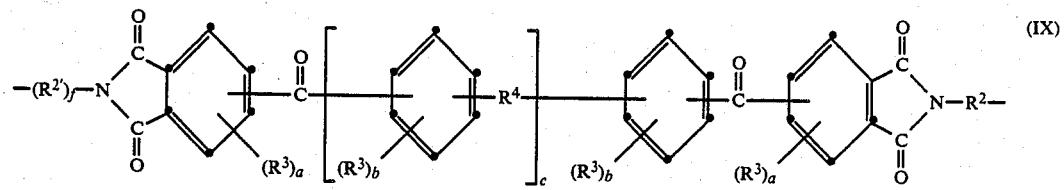

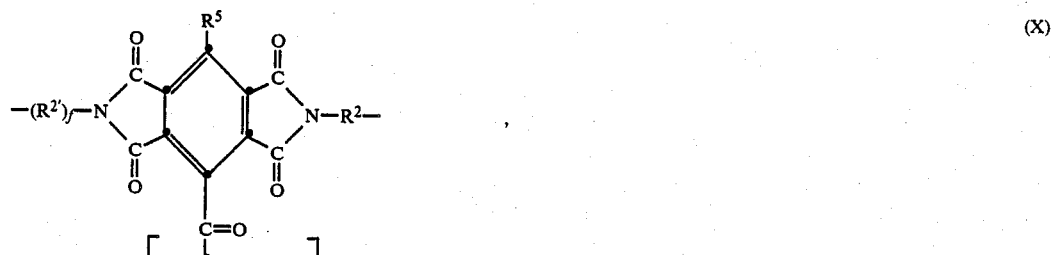

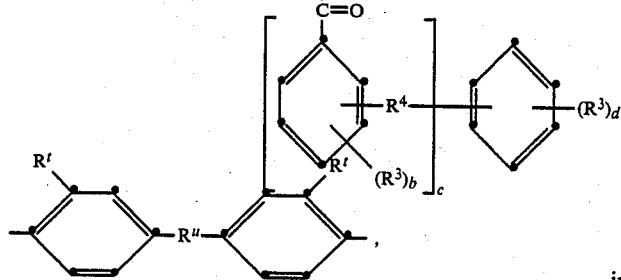

in which $R^3$ is halogen, nitro, $C_1$-$C_6$-alkyl, $C_1$-$C_6$-alkoxy, $C_1$-$C_6$-alkylthio, which can be substituted by phenyl, or is phenyl, phenoxy or phenylthio, $R^4$ is a direct bond or a bridge group, $R^5$ is a hydrogen atom or aroyl or is deifned in the same way as $R^3$, a is 0, 1, 2 or 3, b is 0, 1, 2, 3 or 4, c and d are 0, 1 2, 3, 4 or 5, f is 0 or 1, and, when a, b and d are 2, the two $R^3$ together can also be —CH=CH—CH=CH— bonded in the o-position, and $R^2$ and $R^{2'}$ are an unsubstituted or substituted cycloaliphatic or araliphatic radical, an aromatic radical where two aryl nuclei are linked via an aliphatic group, or an aromatic radical which is substituted by at least one alkyl group, cycloalkyl group, alkoxy group, alkoxyalkyl group, alkylthio group, alkylthioalkyl group, aralkyl group or, on two adjacent C atoms of the aromatic radical, by an alkylene group, $R^2$ being an aromatic radical which is substituted in the two ortho-positions relative to at least one N atom, when f is 0.

30. A process according to claim 26 wherein the self-supporting photostructurable polyimide film in step (i) has a thickness of 3-100 μm and comprises homopolyimides or copolymides which contain structural elements of aromatic aminodicarboxylic acids, having an inherent viscosity of at least 0.1 dl/g, measured at 25° C. in a solution of 0.5% by weight of polyimide in N-methylpyrrolidone, which contain recurring structural elemetns of the formula XI

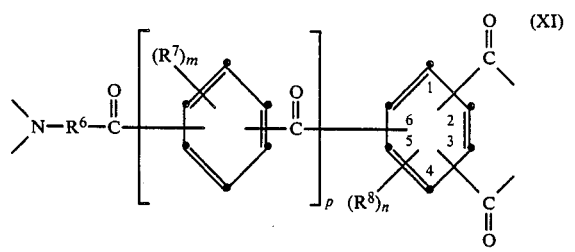

(XI)

in which $R^7$ and $R^8$ are halogen, nitro, aryl, aryloxy, alkyl or alkoxy, m is 0 or a number from 1-4, n is 0 or a number from 1 to 3 and p is 0, 1 or 2, the free carbonyl groups are bonded in ortho-position relative to each other and $R^6$ is a divalent aromatic radical which is substituted by at least one alkyl group or aralkyl group.

31. A process according to claim 26 wherein the photostructurable negative-working thermostable adhesive in step (i) is a compound or mixture of compounds selected from the group consisting of (b1) photocrosslinkable polyimides which are soluble in organic solvents;

(b2) photocrosslinkable polyamidic acids or their esters;

(b3) photocrosslinkable organopolysilsequioxanes;

(b4) photocrosslinkable polyamide-imides;

(b5) photocrosslinkable epoxy systems; and (b6) photocrosslinkable systems which contain compounds having ethylenically unsaturated groups which can undergo free radical polymerization.

32. A process according to claim 31 where the adhesive is (b1) a solution of polyimide or (b1) a solution of polyimide in combination with an organic chromophoric polyazide.

33. A process according to claim 31 wherein the adhesive (b1) comprises a homopolymer or copolymer which is derived from at least one aromatic tetracarboxylic acid and at least one diamine and comprises 0.1 to 100 mol % of at least one structural element of the formula II

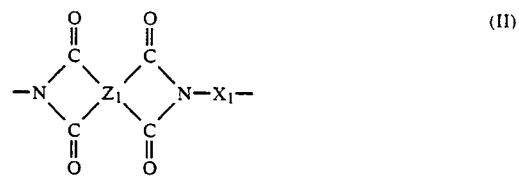

(II)

and 99.9 to 0 mol % of at least one structural element of the formulae III and/or IV

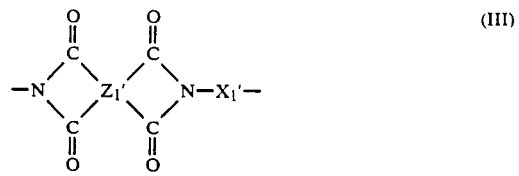

(III)

(IV)

in which $Z_1$ is at least one tetravalent radical of the formulae V, VI, VII or VIII

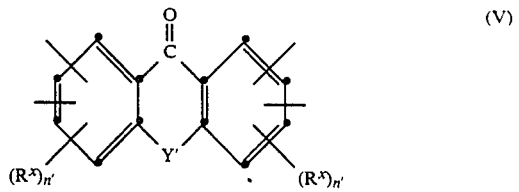

(V)

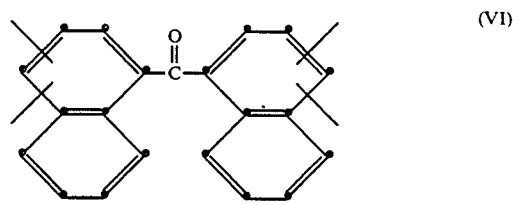

(VI)

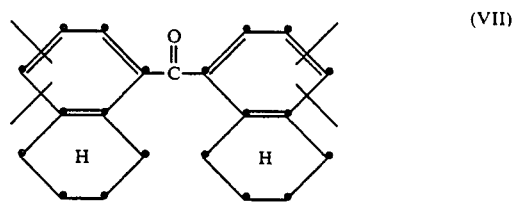

(VII)

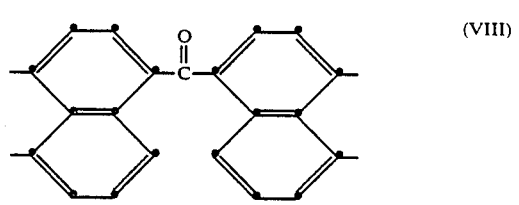

(VIII)

in which the free bonds are bonded in the ortho-position relative to each other and Y' is a direct bond, —CH$_2$—, —(CH$_2$)$_2$—, —O—, —S—, —SO—, —SO$_2$—, —CO—, —NR$^v$— or —CR$^v$R$^w$— where R$^v$ is a hydrogen atom, C$_1$-C$_{10}$-alkyl, phenyl, naphthyl or phenyl (C$_e$H$_{2e}$)— where e is 1 to 4 and R$^w$ is defined in the same way as R$^v$ except that it is not a hydrogen atom, R$^x$ is C$_1$-C$_{10}$-alkyl, halogen —CN, —NO$_2$, C$_1$-C$_{12}$-alkoxy, phenoxy, naphthoxy or phenyl—(C$_e$H$_{2e}$)— where e is 1-4, n' is 0, 1 or 2, X$_1$ is an unsubstituted or substituted heterocyclic, cycloaliphatic or araliphatic radical, an aromatic radical where two aryl nuclei are linked via an aliphatic group, or an aromatic radical which is substituted by at least one alkyl group, cycloalkyl group, alkoxy group, alkoxyalkyl group, alkylthio group, alkylthioalkyl group, hydroxyalkyl group, hydroxyalkoxy group, hydroxyalkylthio group, aralkyl group or, on two adjacent C atoms of the aromatic radical, by an alkylene group, Q$_1$ is a trivalent aromatic radical, Z$_1$' is defined in the same way as Z$_1$ or is a tetravalent organic radical different from Z$_1$, and X$_1$' is the divalent radical, different from X$_1$, of an organic diamine, where Z$_1$ in formula II can also be tetravalent benzophenone radicals if structural elements of the formula IV are present.

34. A process according to claim 32 wherein the adhesive (b1) comprises
   (a) a homopolyimide or copolyimide of aromatic tetracarboxylic acids and aromatic diamines or aromatic and aliphatic diamines which is soluble in organic solvents, at least one aliphatic group being bonded directly or via a bridge group to at least a portion of the tetracarboxylic acid radicals, of the aromatic diamine radicals or of the two radicals, and/ or at least a portion of these radicals containing, as an aliphatic bridge group, alkylene, alkylidene, cycloalkylidene or Si(alkyl)$_2$, and
   (b) at least 0.1% by weight, based on the polyimide component, of at least one organic chromophoric polyazide in which the azide groups are bonded directly or via an SO$_2$ group to aromatic hydrocarbon radicals.

35. A process according to claim 34 wherein the homopolyimide or copolymide comprises 50 to 100 mol % of recurring structural elements of the formulae XVII and/or XVIII

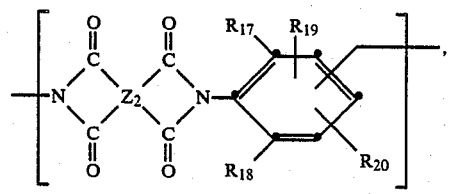
(XVII)

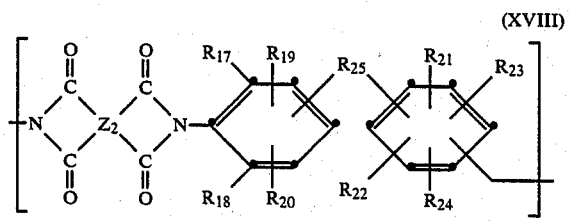
(XVIII)

and 50 to 0 mol % of recurring structural elements of the formula XIX

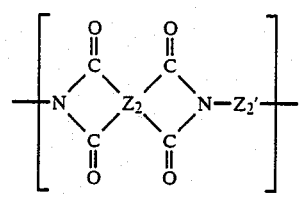
(XIX)

where in the formulae XVII, XVIII and XIX the four carbonyl groups are bonded to different carbon atoms and two carbonyl groups each are in ortho- or peri-position relative to each other, Z$_2$ is a tetravalent radical which contains at least one aromatic ring, Z$_2$40 is a divalent organic radical which differs from the groups

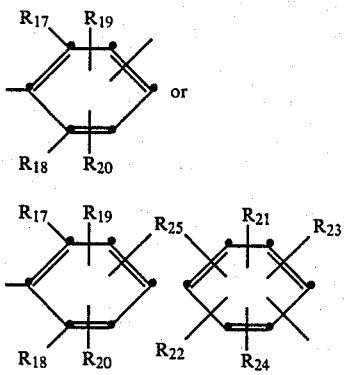

and is selected from the group consisting of aromatic, alkylaromatic, aliphatic, cycloaliphatic and heterocyclic radicals, combinations thereof and radicals with oxygen-, sulfide-, nitrogen-, silicon- or phosphorous-containing bridge groups, R$_{17}$ and R$_{18}$ independently of each other are alkyl with 1-4 C atoms, R$_{19}$, R$_{20}$, R$_{21}$, R$_{22}$, R$_{23}$ and R$_{24}$ independently of one another are hydrogen or alkyl having 1-4 C atoms and R$_{25}$ is a direct bond, —O—, —S—, —SO$_2$, —CO—, —CH$_2$—, —C(CF$_3$)$_2$—, cycloalkylidene having 5-6 ring carbon atoms, phenylene,

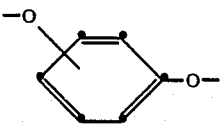

or a group

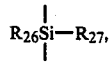

in which R$_{26}$ and R$_{27}$ are alkyl or alkoxy each having 1-6 C atoms, phenyl, benzyl, phenyloxy or benzyloxy.

36. A process according to claim 31 in which the thickness of the adhesive layer in the fully cured state is less than 5 μm and the photostructurable negative-working thermostable adhesive used is an organopolysilsesquinoxane of the formula XXXI

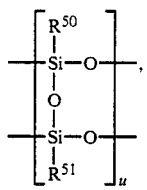
(XXXI)

in which $R^{50}$ and $R^{51}$ are independently of each other monovalent hydrocarbon radicals and u is a whole number greater than 30.

37. A process according to claim 31 in which the adhesive (b4) comprises linear saturated homopolycondensates or copolycondensates from the group of the polyamide-imides having benzophenonetricarboxylic acid radicals with at least one recurring structural element of the formula XII

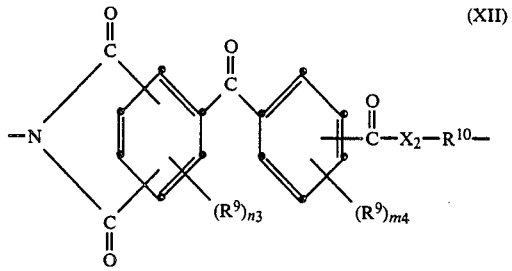
(XII)

and in the case of copolycondensates additionally recurring structural elementrs of the formulae XIII and/or XIV

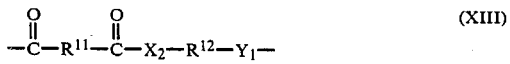
(XIII)

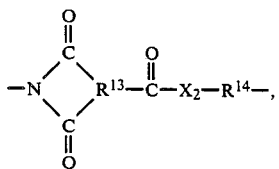
(XIV)

in which the imide group in structural element XII is bonded to two adjacent C atoms, $m_4$ is 0 or a number from 1 to 4 and $n_3$ is 0 or a number from 1 to 3, $X_2$ is —S—, —O— or —NR$^{15}$— and $Y_1$ independently is defined in the same way as $X_2$, $R^9$ is alkyl or alkoxy having fewer than 6 C atoms, aryl having 6 to 10 C atoms, aralkyl having 7 to 10 C atoms or halogen, $R^{12}$ is an unsubstituted or substituted divalent aliphatic, cycloaliphatic, araliphatic or aromatic radical, and if $X_2$ and $Y_1$ are the group —NR$^{15}$—, $R^{12}$ and one of the $R^{15}$ are together alkylene having 5 to 7 C atoms to which the second —NR$^{15}$— group is bonded, or $R^{12}$ is methylene, ethylene or propylene and the two $R^{15}$ of the NR$^{15}$ groups are together ethylene or propylene or $X_2$ or $Y_1$ are —S— or —O— and the other —NR$^{15}$—, $R^{12}$ and $R^{15}$ together are alkylene having 5–7 C atoms to which the group —O— or —S— is bonded, $R^{10}$ is an unsubstituted or substituted divalent aliphatic or aromatic hydrocarbon radical, $R^{14}$ is independently defined in the same way as $R^{10}$, $R^{11}$ is a divalent saturated aliphatic or aromatic radical, $R^{13}$ is a trivalent saturated aliphatic or aromatic radical in which the imide group is bonded to two adjacent C atoms and $R^{15}$ is a hydrogen atom, alkyl, cycloalkyl, aryl, aralkyl or alkaralkyl, the polycondensates containing the structural elements of the formula XII in an amount of at least 10 mol %, based on the copolycondensate.

38. A process according to claim 31 in which the adhesive (b5) comprises a photocrosslinkable epoxy resin or mixture of such resins containing
(a) an aromatic, cycloaliphatic or araliphatic compound which contains at least one 1,2-epoxy group,
(b) at least one photoinitiator suitable for the photocrosslinking of epoxy resins alone or in combination with
(c) a photoaccelerant, and, at least one aromatic, cycloaliphatic or araliphatic compound usable as a latent not-curing agent.

39. A process according to claim 38 in which photoinitiator (b) is a halonium salt of the formula XXXIII

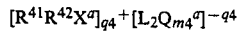   XXXIII in which $R^{41}$ and $R^{42}$ independently of each other are a carbocyclic or heterocyclic aromatic radical having 6 to 20 C atoms or $R^{41}$ and $R^{42}$ together are a divalent carbocyclic or heterocyclic aromatic radical, $X^a$ is a halogen atom, $m_4$ is a number which is equal to the total of the valencies of $L_2$ and $q_4$, $L_2$ is a divalent to heptavalent metal or non-metal and $Q^a$ is a halogen atom, and $q^4$ is a number from 1 to 3.

40. A process according to claim 38 in which photoinitiator (b) is an iodosyl salt of the formula XXXIV

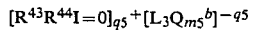   XXXIV.

in which $R^{43}$ and $R^{44}$ are a carbocyclic or heterocyclic aromatic radical haivng 6 to 20 C atoms, $m_5$ is a number which is equal to the total of the valencies of $L_3$ and $q_5$, $L_3$ is a divalent to heptavalent metal or non-metal and $Q^b$ is a halogen atom, and $q_5$ is a number from 1 to 3.

41. A process according to claim 38 in which the photoinitiator used is a sulfonium salt of the formula XXXV

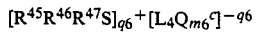   XXXV in which $R^{45}$, $R^{46}$, and $R^{47}$ independently of one another are a carbocylic or heterocyclic aromatic radical having 6 to 20 C atoms or one of $R_{45}$, $R_{46}$, $R_{46}$ and $R_{47}$ is this aromatic radical and the other two together are a divalent carbocyclic or heterocyclic aromatic radical, $m_6$ is a number which is equal to the sum of the valencies of $L_4$ and $q_6$, $L_4$ is a divalent to heptavalent metal or non-metal and $Q^c$ is a halogen atom, and $q_6$ is a number from 1 to 3.

42. A process according to claim 38 in which photoinitiator (b) is
(I) an active amount of a salt of the formula XXVIII

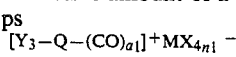   (XXVIII).

in which $Y_3$ is an arene group or dienylium group, Q is an atom of a transition metal selected from the group consisting of titanium, vandium, chromium, manganese, iron, cobalt, nickel, copper, niobium, molybdenum, ruthenium, rhodium, palladium, silver, tantalum, tungsten, rhenium, osmium, iridium, platinum and gold, $a_1$ is a positive whole number such that the atom Q has a complete electron shell configuration, M is an atom of a metal or non-metal, $n_1$ 4, 5 or 6 and larger by unity than the valency of M and $X_4$ is a fluorine or chlorine atom, with the proviso that, when M is antimony, $n_1$ is 6 and five of the symbols $X_4$ are fluorine, and one can also be a hydroxo group; or (II) an active amount of a salt of the formula XXIX

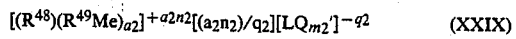

$$[(R^{48})(R^{49}Me)_{a_2}]^{+a_2n_2}[(a_2n_2)/q_2][LQ_{m_2'}]^{-q_2} \quad \text{(XXIX)}$$

in which $a_2$ is 1 or 2 and $n_2$ and $q_2$ indenpendently of each other are each a whole number from 1 to 3, Me is the cation of a monovalent to trivalent metal from the group IVb to VIIb, VIII or Ib of the Periodic Table of Elements, $m_2$ is a whole number equal to the valency of L and $q_2$ and Q' is a halogen atom, L is a divalent to heptavalent metal or non-metal, $R^{48}$ is a π-arene and $R^{49}$ is a π-arene or the anion of a π-arene.

43. A process according to claim 42 in which photoinitiator (b) is at least one iron compound of the formula XXX

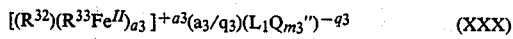

$$[(R^{32})(R^{33}Fe^{II})_{a_3}]^{+a_3}(a_3/q_3)(L_1Q_{m_3''})^{-q_3} \quad \text{(XXX)}$$

in which $a_3$ is 1 or 2 and $q_3$ is 1, 2 or 3,
$L_1$ is a divalent to heptavalent metal or non-metal,
Q" is a halogen atom,
$m_3$ is a whole number which is equal to the total of the valencies of $L_1$ and $q_3$,
$R^{32}$ is a π-arene and $R^{33}$ is the anion of a π-arene; in which the compound of the formula XXX is used together with at least one electron accpetor as oxidizing agent and/or together with a sensitizer for the compound of the formula XXX.

44. A process according to claim 38 in which adhesive (b5) is a phtocrosslinkable and subsequently still heat-cruable epoxy resin based on bisphenol diglycidyl ethers, which in addition to free epoxy groups also contains photocrosslinkable radicals

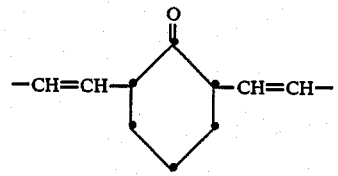

which are present in an amount of at least 10 mol %, based on the bisphenol units, as bridges between the aromatic nuclei of the bisphenol.

45. A process according to claim 38 in which adhesive (b5) comprises a mixture of compounds having ethylenically unsaturated groups which can undergo free radical polymerization, selected from the group consisting of (A) mixtures which comprise
  (a) at least one ethylenically unsaturated compound which can undergo free radical polymerization and has a boiling point above 100° C. under atmospheric pressure,
  (b) at least one organic, inorganic or organometallic photoinitiator which, on irradiation, forms free radicals, and
  (c) a polymeric binder; or
(B) mixtures which comprise
  (a) compounds or mixtures of compounds having not only at least one medial epoxy group and/or at least one structural element of the formula XXXII,

which is bonded terminally directly to an oxygen atom or nitrogen atom, in which $R^{34}$ and $R^{36}$ are each a hydrogne atom, when $R^{35}$ is then a hydrogen atom or a methyl group, or $R^{34}$ and $R^{36}$ together are —CH$_2$—CH$_2$, when $R^{35}$ is then a hydrogen atom, but also having at least one ethylenically unsaturated double bond in a molecule, and
  (b) at least one photoinitiator which, on irradiation, forms free radicals alone or in combination with
  (c) polymeric binder, a heat-activatable polymerizing agent for 1,2-epoxy resins and/or photosensitizers or photoinitiators for epoxy polymerization; or
(C) mixtures which comprise
  (a) an epoxy resin having at least one medial epoxy group and/or at least one epoxy group of the formula XXXII, as defined above, and
  (b) a compound which can undergo free radical photopolymeriation or in combination with
  (c) a heat-activatable curing agent for the epoxy resin.

46. A process according to claim 26 in which the substrate has a scattering surface and in which the adhesive contains a radiation-absorbing additive in such amount that light scattered laterally at the substrate surface does not penetrate into the adhesive or into the polyimide film.

47. A process according to claim 26 wherein the self supporting photostructurable polyimide film in step (ii) has a thickness of 3–300 μm and comprises a homopolyimide or copolyimide which has 5 to 100 mol %, based on the total molecule, of at least one structural element of the formula Ia and 95–0 mol % of at least one structural element of the formula Ib,

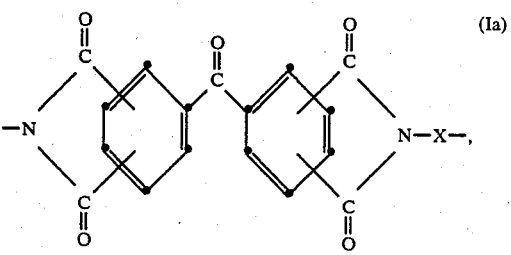

-continued

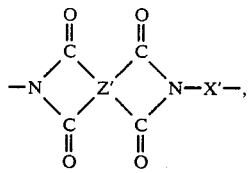
(Ib)

where the carbonyl groups in the formula Ia are in each case pairwise in the ortho-position relative to each other, Z' is a tetravalent benzophenone radical or another unsubstituted or substituted tetravalent aromatic radical to which in each case two carbonyl groups are bonded in the ortho- or peri-position, X is a divalent radical of an aromatic diamine wherein the aromatic ring is substituted by alkyl, alkoxy, alkoxyalkyl or aralkyl in both ortho-positions relative to at least one N atom or in at least one ortho-position relative to both N atoms, or two adjacent C atoms of hte aromatic ring are substituted by alkylene, and X' is a divalent radical of an aromatic diamine which differs from X or a divalent radical of an aliphatic diamine.

48. A process according to claim 47 where in the polyimide polymer at least 50 mol % of the polymer, based on the total molecule, comprise structural elements of the formula Ia, and wherein the radical Z' of the structural element of the formula Ib is independently selected from the group consisting of

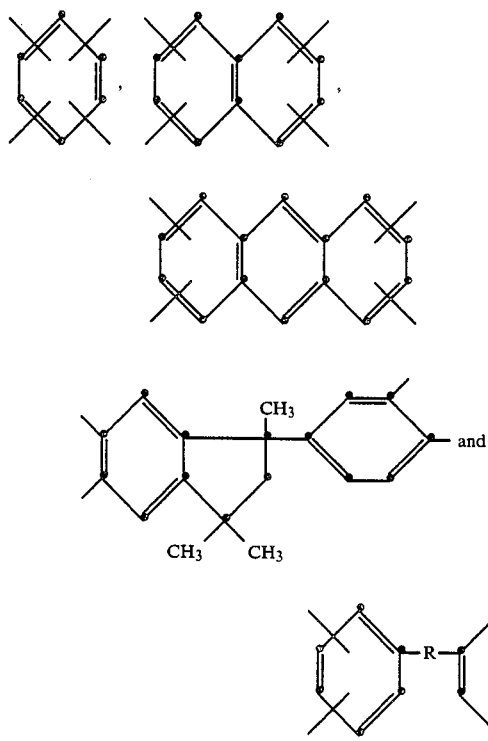

in which R is a direct bond or is

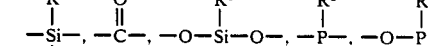

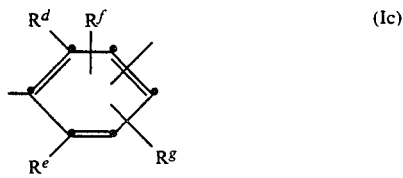

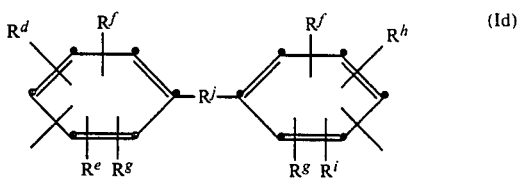

in which $R^a$, $R^b$ and $R^c$ are alkyl having 1 to 6 C atoms, phenyl or benzyl or $R^b$ and $R^c$ are also alkoxy having 1 to 6 C atoms, phenyloxy or benzyloxy, X' of the structural element Ib is $C_2$-$C_{30}$ alkylene, $C_5$-$C_8$cycloalkylene, $C_7$-$C_{30}$aralkylene, $C_6$-$C_{22}$ arylene or polysiloxane, X of structural element Ia is

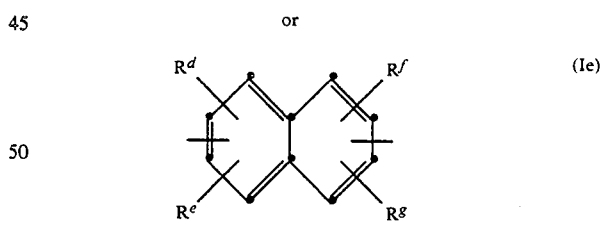

in which, in the formula Ic, the free bonds are in the meta- or para-position relative to each other, in the formula Id the free bonds are in the meta- or para-position relative to hte $R^j$ group and $R^d$ and $R^e$ are bonded in the two ortho-positions relative to the free bond, and in the formula Ie the free bonds are bonded in the 2-, 3-, 6- and 7-position and $R^d$ and $R^e$ are situated in the two ortho-positions relative to the free bonds, $R^j$ is a direct bond, —O—, —S—, —SS—, —SO—, —SO₂, —CO—, —COO—, —NH—, $-\overset{|}{\text{N}}-$alkyl having 1 to 6 C atoms in the alkyl, $-\overset{|}{\text{N}}-$phenyl, -continued

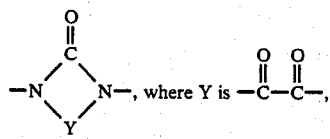

in the alkyl, —CON—phenyl, —CON—benzyl,

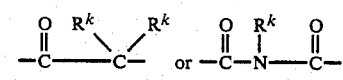

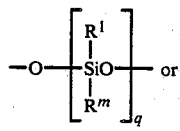

$R^k$ is a hydrogen atom, $C_1$-$C_6$ alkyl or phenyl, or the group $R^j$ is a linear or branched alkylene grop having 1 to 3 C atoms, alkylidene which has 2 to 12 C atoms and can be subsituted by Cl or F, cycloalkylidene having 5 or 6 ring carbon atoms, phenylene, phenylenedioxy, or the group $R^1SiR^m$,

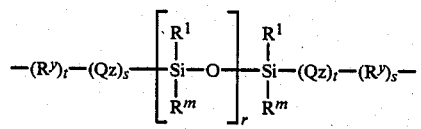

in which $R^1$ and $R^m$ are alkyl or alkoxy having 1 to 6 C atoms, phenyl, benzyl, phenyloxy or benzyloxy, r is a number from 1 to 10, t is 0 or 1 and s is 0 or 1, and RY is —O— or —S— and $Q_2$ is $C_1$-$C_6$-alkylene, and q is a number from 1 to 100, $R^d$ and $R^e$ are alkyl or alkoxy having 1 to 12 C atoms, alkoxyalkyl having 2 to 12 C atoms, cyclopentyl, cyclohexyl or benzyl or in the formulae Ic or Id, $R^d$ and $R^f$ are in adjacent positions and together are trimethylene or tetramethylene, and $R^e$ can also be a hydrogen atom, $R^f$, $R_g$, $R^h$ and $R^i$ are independently a hydrogen atom or alkyl or alkoxy having a 1 to 12 C atoms, alkoxyalkyl having 2 to 12 C atoms, cyclopentyl, cyclohexyl or benzyl or $R^f$ and $R^h$ in the formula Id together are trimethylene or tetramethylene.

49. A process according to claim 48 wherein Z' is a radical of the formula

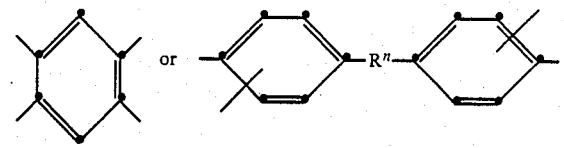

in which $R^n$ is a direct bond, —O—, —$SO_2$—, —$CH_2$—, —C($CF_3$)$_2$ or —CO—, in which the radical X is selected from the group consisting of

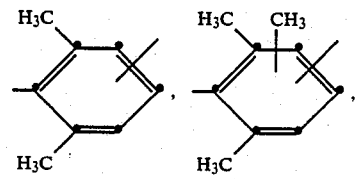

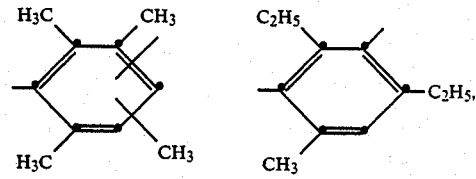

in which the free bonds are in the meta- or para-position relative to each other, and

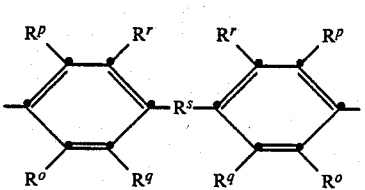

in which $R^o$ and $R^p$ are independently mthyl, ethyl, n-propyl or isopropyl and $R^q$ and $R^r$ are a hydrogen atom or are defined on the same way as $R^o$ or $R^o$ and $R^q$ are together trimethylene or tetramethylene and $R^p$ and $R^r$ are a hydrogen atom, and $R^s$ is a direct bond, —$CH_2$—, —C($CF_3$)$_2$—, 2,2-propylidene or —CO—, and in which the radical X' is selected from the group consisting of

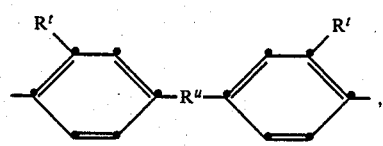

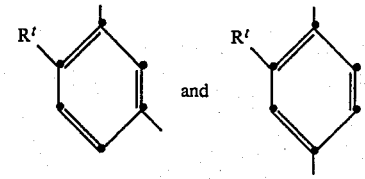

in which $R^u$ is a direct bond, —O—, —CO—, —C($CF_3$)$_2$— or —$CH_2$—, and $R^t$ is methyl, ethyl, isopropyl, methoxy or a hydrogen atom.

* * * * *